United States Patent
Zhang et al.

(10) Patent No.: US 9,972,266 B2
(45) Date of Patent: May 15, 2018

(54) GATE DRIVING CIRCUITS AND DISPLAY DEVICES

(71) Applicant: Shenzhen China Star Optoelectronics Technology Co., Ltd., Shenzhen, Guangdong (CN)

(72) Inventors: Shengdong Zhang, Guangdong (CN); Zhijin Hu, Guangdong (CN); Congwei Liao, Guangdong (CN); Shijie Cao, Guangdong (CN); Chang-yeh Lee, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 300 days.

(21) Appl. No.: 14/917,942

(22) PCT Filed: Jan. 18, 2016

(86) PCT No.: PCT/CN2016/071170
§ 371 (c)(1),
(2) Date: Mar. 9, 2016

(87) PCT Pub. No.: WO2017/113447
PCT Pub. Date: Jul. 6, 2017

(65) Prior Publication Data
US 2018/0061347 A1    Mar. 1, 2018

(30) Foreign Application Priority Data

Dec. 28, 2015  (CN) .......................... 2015 1 1006178

(51) Int. Cl.
*G09G 3/36* (2006.01)

(52) U.S. Cl.
CPC ... *G09G 3/3677* (2013.01); *G09G 2300/0408* (2013.01); *G09G 2310/0289* (2013.01); *G09G 2310/08* (2013.01)

(58) Field of Classification Search
CPC ............ G09G 3/3677; G09G 2310/08; G09G 2310/0289; G09G 2300/0408
See application file for complete search history.

(56) References Cited

U.S. PATENT DOCUMENTS

| | | | |
|---|---|---|---|
| 2008/0101529 | A1 | 5/2008 | Tobita |
| 2013/0169609 | A1 | 6/2013 | Son et al. |
| 2014/0085285 | A1 | 3/2014 | Kim |
| 2016/0189652 | A1 | 6/2016 | Xiao |

FOREIGN PATENT DOCUMENTS

| | | |
|---|---|---|
| CN | 104409038 A | 3/2015 |
| CN | 104795013 A | 7/2015 |
| CN | 104809973 A | 7/2015 |
| CN | 105139825 A | 12/2015 |
| KR | 20140024994 A | 3/2017 |

*Primary Examiner* — Abhishek Sarma
(74) *Attorney, Agent, or Firm* — Andrew C. Cheng

(57) ABSTRACT

A gate driving circuit and a display device are disclosed. The gate driving circuit includes a control module for pulling down the level of the second control node to be at the low level before the gate strobe signals are outputted and during the output period of the gate cutoff signals. In this way, the second pull-down control end of the low level maintaining module is pulled down to be at the low levels, and the low level maintaining module is in the off state. In this way, the electrical leakage of the low level maintaining module may be reduced so as to decrease the output delay of the gate signals and to enhance the efficiency of the circuit.

20 Claims, 17 Drawing Sheets

GATE DRIVING CIRCUITS AND DISPLAY DEVICES

BACKGROUND OF THE INVENTION

1. Field of the Invention

The present disclosure relates to display technology, and more particularly to a gate driving circuit and a display device.

2. Discussion of the Related Art

Flat-Panel-Displays (FPD) are characterized by attributes such as high resolution, no flicker, power-saving, and thin and light, and thus have become the main trend. Recently, FPD are designed to be high frame rate, high resolution, and narrow border.

With respect to the driving method of FPDs, conventionally, an integrated circuit (IC) is adopted and the peripheral driving circuits are encapsulated on the liquid crystal panel via chip on glass (COG). However, such configuration not only contrary to the thin and light design, but also may cause higher cost. When the number of pins of the peripheral driving circuits is large, the mechanical and electrical reliability of the display device may be affected. In particular, such defect may be more serious for the high-resolution displays. Integrated display driving circuit may resolve the above issues. The integrated display driving circuit relates to the technology wherein the peripheral driving circuits, such as the gate driving circuit and the data driving circuit, are manufactured on the liquid crystal panel via thin film transistors (TFTs). Compared to the conventional COG driving method, the number of the driving chips and the encapsulation process may be decreased. Not only the cost is reduced, but also the display device may be thinner, which enhances the mechanical and electrical reliability of the display device.

Gate driver on array (GOA) has been widely adopted. However, greater demand toward the operation frequency of the driving circuit and the dimension occupied by the circuit have been proposed along the high frame rate, high resolution, and narrow border trend. Within the integrated gate driving circuit, the low level of the output signals of the gate driving circuit has to be maintained by the low level maintaining transistor. However, during the driving phase of the gate driving circuit, the level of the control pole of the low level maintaining transistor cannot be completely pulled down to be at the low level, which may result in electrical leakage. Such defect may also increase the pull-up and pull-down delay of the output pulse of the gate driving circuit such that the efficiency of the circuit is limited.

SUMMARY

The present disclosure relates to a gate driving circuit and a display device for reducing the electrical leakage of the low level maintaining module so as to decrease the output delay of the gate signals and to enhance the efficiency of the circuit.

In one aspect, a gate driving circuit for driving liquid crystal panels includes: M number of cascaded gate driving units, wherein M is an integer larger than one, each of the gate driving units includes an input module, an output module, a control module, and a first low level maintaining module; the input module includes a pulse signal input end for inputting first pulse signals, a first pull-down control end for inputting first control signals, and a control signal output end coupling with a first control node, the input module controls a level of the first control node in accordance with the first pulse signals and the first control signals; the output module includes a driving control end coupling with the first control node, a clock signal input end for inputting first clock signals, and an output end of gate signals, when being controlled by the level of the first control node, the output module outputs gate strobe signals and gate cutoff signals via the output end of gate signals; the control module includes a clock signal input end for inputting first clock signals, a first input signal end for inputting first input signals, a second pull-down control end coupling a second control node, a first control end coupling with the first control node, and a first pull-down end coupling with a low level node, the low level node is configured for inputting low level signals, when being controlled by a high level of the first control node, the control module pulls down the level of the second control node to be at the low level before the output module outputs the gate strobe signals and during an output period of the gate cutoff signals; the first low level maintaining module includes a third pull down control end coupling with the second control node, a first end coupling with the first control node, a second end coupling with the output end of the gate driving signals of the output module, and a third end coupling with the low level node, when being controlled by the low level of second control node, the first low level maintaining module is in an off state before the output module outputs the gate strobe signals and during an output period of the gate cutoff signals; wherein an input end of the pulse signals of the gate driving unit at the N-th level connects to the output end of the gate signals of the gate driving unit at the (N−1)-th level, wherein N is an integer and is in a range of 1<N≤M, or the input end of the pulse signals of the gate driving unit at the N-th level connects to the output end of the gate signals of the gate driving unit at the (N−2)-th level, wherein N is an integer and is in a range of 2<N≤M.

Wherein: the input module includes a first transistor and a third transistor, a gate of the first transistor connects with a first pole of the first transistor for inputting the first pulse signals, a second pole of the first transistor and the first pole of the third transistor connect to the first control node, a gate of the third transistor is configured for inputting the first control signals, the first control signals are second pulse signals or second clock signals, the high level of the first clock signals and the high level of the second clock signals are overlapped for ¼ clock period; the output module includes a second transistor, and a gate of the second transistor connects to the first control node, a first pole of the second transistor is configured for inputting the first clock signals, and a second pole of the second transistor is the output end of the gate signals; the control module includes a fourth transistor, a fifth transistor, an eighth transistor, and a second capacitor, wherein a gate of the fourth transistor and a first pole of the eighth transistor connect with one end of the second capacitor, and the other end of the second capacitor is configured for inputting the first clock signals, gates of the eighth transistor and the fifth transistor connect to the first control node, a second pole of the eighth transistor and a second pole of the fifth transistor connects to the low level node, a first pole of the fifth transistor and a second pole of the fourth transistor connect to the second control end, and the first pole of the fourth transistor is configured for inputting the first input signals; and the first low level maintaining module includes a sixth transistor and a seventh transistor, wherein a gate of the sixth transistor and a gate of the seventh transistor connect to the second control node, a first pole of the sixth transistor connects with the first control node, a second pole of the sixth transistor and a second pole of the seventh transistor connects to the low level node, and the first pole of the seventh transistor connects to the second pole of the second transistor.

Wherein for each of the gate driving units at the first through the (M−4)-th level, the second pole of the third transistor connects to the low level node, and the first control signals inputted from the gate of the third transistor are the second pulse signals; and for each of the gate driving units at the (M−3)-th through the M-th level, the second pole of the third transistor connects to the first pole of the first transistor, and the first control signals inputted from the gate of the third transistor are the second clock signals.

Wherein the control module further includes a fifteenth transistor, a gate of the fifteenth transistor connects to the gate of the first transistor, a first pole of the fifteenth transistor connects to the second control node, and the second pole of the fifteenth transistor connects to the low level node.

Wherein the gate driving unit further includes a second low level maintaining module, the control module further includes a ninth transistor and a tenth transistor, and the second low level maintaining module includes an eleventh transistor and a twelevth transistor; wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelevth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelevth transistor connect to the low level node, and the first pole of the twelevth transistor connects to the first control node; and the first input signals inputted by the fourth transistor are the fourth clock signals, wherein the third clock signals and the fourth clock signals are two low frequency clock signals.

Wherein the control module further includes a thirteenth transistor and a fourteenth transistor, a gate of the thirteenth transistor is configured for inputting the third clock signals, a first pole of the thirteenth transistor connects to the first pole of the fourth transistor, a second pole of the thirteenth transistor connects to the second control node, a gate of the fourteenth transistor is configured for inputting the fourth clock signals, a first pole of the fourteenth transistor connects to the first pole of the ninth transistor, and a second pole of the fourteenth transistor connects to the second pole of the ninth transistor.

Wherein the control module further includes a sixteenth transistor and a seventeenth transistor, a gate of the sixteenth transistor and a gate of the seventeenth transistor connects to the gate of the first transistor, a first pole of the sixteenth transistor connects to the second pole of the ninth transistor, and a second pole of the sixteenth transistor and a second pole of the seventeenth transistor connects to the low level node, and the first pole of the seventeenth transistor connects to the second control node.

Wherein for each of the gate driving units at the first through the (M−4)-th level, the second pole of the third transistor connects to the low level node, and the first control signals inputted from the gate of the third transistor are the second pulse signals; and for each of the gate driving units at the (M−3)-th through the M-th level, the second pole of the third transistor connects to the first pole of the first transistor, and the first control signals inputted from the gate of the third transistor are the second clock signals.

Wherein each of the gate driving unit further includes a second low level maintaining module including an eighteenth transistor and a nineteenth transistor; wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level; and the first input signals from the first pole of the fourth transistor of the gate driving unit at the current level are the fourth clock signals.

Wherein for each of the gate driving units at the first level and at the (M−3)-th through the M-th level, the gate driving unit further includes a second low level maintaining module, the control module within each of the gate driving units at the first level and at the (M−3)-th through the M-th level further includes a ninth transistor and a tenth transistor, and the second low level maintaining module further includes an eleventh transistor and a twelevth transistor; wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelevth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelevth transistor connect to the low level node, and the first pole of the twelevth transistor connects to the first control node, the first input signals from the first pole of the fourth transistor are the fourth clock signals, and the third clock signals and the fourth clock signals are two low frequency signals; wherein the second pole of the third transistor of the gate driving unit at the first level connects to the low level node, and the first control signals inputted from the gate of the third transistor are the second pulse signals, for each of the gate driving units at the first level and at the (M−3)-th through the M-th level, the second pole of the third transistor connects to the first pole of the first transistor to input the first pulse signals, and the first control signals inputted by the gate of the third transistor are the second clock signals; for each of the gate driving units at the second through the (M−4)-th level, the gate driving unit further includes an eighteenth transistor and a nineteenth transistor, wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level, the first input signals from the first pole of the fourth transistor of the gate driving unit at the current level are the fourth clock signals; and wherein for each of the gate driving units at the second through the (M−4)-th level, the second pole of the third transistor connects to the low level node, and the first control signals inputted from the gate of the third transistor are the second pulse signals.

In another aspect, a display device includes: a plurality of scanning lines and a gate driving circuit for providing gate signals to the scanning lines; the gate driving circuit includes M number of cascaded gate driving units, wherein M is an integer larger than one, each of the gate driving units includes an input module, an output module, a control module, and a first low level maintaining module; the input module includes a pulse signal input end for inputting first pulse signals, a first pull-down control end for inputting first control signals, and a control signal output end coupling with a first control node, the input module controls a level of the first control node in accordance with the first pulse signals and the first control signals; the output module includes a driving control end coupling with the first control node, a clock signal input end for inputting first clock signals, and an output end of gate signals, when being controlled by the level of the first control node, the output module outputs gate strobe signals and gate cutoff signals via the output end of gate signals; the control module includes a clock signal input end for inputting first clock signals, a first input signal end for inputting first input signals, a second pull-down control end coupling a second control node, a first control end coupling with the first control node, and a first pull-down end coupling with a low level node, the low level node is configured for inputting low level signals, when being controlled by a high level of the first control node, the control module pulls down the level of the second control node to be at the low level before the output module outputs the gate strobe signals and during an output period of the gate cutoff signals; the first low level maintaining module includes a third pull down control end coupling with the second control node, a first end coupling with the first control node, a second end coupling with the output end of the gate driving signals of the output module, and a third end coupling with the low level node, when being controlled by the low level of second control node, the first low level maintaining module is in an off state before the output module outputs the gate strobe signals and during an output period of the gate cutoff signals; wherein an input end of the pulse signals of the gate driving unit at the N-th level connects to the output end of the gate signals of the gate driving unit at the (N−1)-th level, wherein N is an integer and is in a range of 1<N≤M, or the input end of the pulse signals of the gate driving unit at the N-th level connects to the output end of the gate signals of the gate driving unit at the (N−2)-th level, wherein N is an integer and is in a range of 2<N≤M.

Wherein: the input module includes a first transistor and a third transistor, a gate of the first transistor connects with a first pole of the first transistor for inputting the first pulse signals, a second pole of the first transistor and the first pole of the third transistor connect to the first control node, a gate of the third transistor is configured for inputting the first control signals, the first control signals are second pulse signals or second clock signals, the high level of the first clock signals and the high level of the second clock signals are overlapped for ¼ clock period; the output module includes a second transistor, and a gate of the second transistor connects to the first control node, a first pole of the second transistor is configured for inputting the first clock signals, and a second pole of the second transistor is the output end of the gate signals; the control module includes a fourth transistor, a fifth transistor, an eighth transistor, and a second capacitor, wherein a gate of the fourth transistor and a first pole of the eighth transistor connect with one end of the second capacitor, and the other end of the second capacitor is configured for inputting the first clock signals, gates of the eighth transistor and the fifth transistor connect to the first control node, a second pole of the eighth transistor and a second pole of the fifth transistor connects to the low level node, a first pole of the fifth transistor and a second pole of the fourth transistor connect to the second control end, and the first pole of the fourth transistor is configured for inputting the first input signals; and the first low level maintaining module includes a sixth transistor and a seventh transistor, wherein a gate of the sixth transistor and a gate of the seventh transistor connect to the second control node, a first pole of the sixth transistor connects with the first control node, a second pole of the sixth transistor and a second pole of the seventh transistor connects to the low level node, and the first pole of the seventh transistor connects to the second pole of the second transistor.

Wherein for each of the gate driving units at the first through the (M−4)-th level, the second pole of the third transistor connects to the low level node, and the first control signals inputted from the gate of the third transistor are the second pulse signals; and for each of the gate driving units at the (M−3)-th through the M-th level, the second pole of the third transistor connects to the first pole of the first transistor, and the first control signals inputted from the gate of the third transistor are the second clock signals.

Wherein the control module further includes a fifteenth transistor, a gate of the fifteenth transistor connects to the gate of the first transistor, a first pole of the fifteenth transistor connects to the second control node, and the second pole of the fifteenth transistor connects to the low level node.

Wherein the gate driving unit further includes a second low level maintaining module, the control module further includes a ninth transistor and a tenth transistor, and the second low level maintaining module includes an eleventh transistor and a twelevth transistor; wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelevth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelevth transistor connect to the low level node, and the first pole of the twelevth transistor connects to the first control node; and the first input signals inputted by the fourth transistor are the fourth clock signals, wherein the third clock signals and the fourth clock signals are two low frequency clock signals.

Wherein the control module further includes a thirteenth transistor and a fourteenth transistor, a gate of the thirteenth transistor is configured for inputting the third clock signals, a first pole of the thirteenth transistor connects to the first pole of the fourth transistor, a second pole of the thirteenth transistor connects to the second control node, a gate of the fourteenth transistor is configured for inputting the fourth clock signals, a first pole of the fourteenth transistor connects to the first pole of the ninth transistor, and a second pole of the fourteenth transistor connects to the second pole of the ninth transistor.

Wherein the control module further includes a sixteenth transistor and a seventeenth transistor, a gate of the sixteenth transistor and a gate of the seventeenth transistor connects to the gate of the first transistor, a first pole of the sixteenth transistor connects to the second pole of the ninth transistor, and a second pole of the sixteenth transistor and a second pole of the seventeenth transistor connects to the low level node, and the first pole of the seventeenth transistor connects to the second control node.

Wherein for each of the gate driving units at the first through the (M−4)-th level, the second pole of the third transistor connects to the low level node, and the first control signals inputted from the gate of the third transistor are the second pulse signals; and for each of the gate driving units at the (M−3)-th through the M-th level, the second pole of the third transistor connects to the first pole of the first transistor, and the first control signals inputted from the gate of the third transistor are the second clock signals.

Wherein each of the gate driving unit further includes a second low level maintaining module including an eighteenth transistor and a nineteenth transistor; wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level; and the first input signals from the first pole of the fourth transistor of the gate driving unit at the current level are the fourth clock signals.

Wherein for each of the gate driving units at the first level and at the (M−3)-th through the M-th level, the gate driving unit further includes a second low level maintaining module, the control module within each of the gate driving units at the first level and at the (M−3)-th through the M-th level further includes a ninth transistor and a tenth transistor, and the second low level maintaining module 16 further includes an eleventh transistor and a twelvth transistor; wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelvth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelvth transistor connect to the low level node, and the first pole of the twelvth transistor connects to the first control node, the first input signals from the first pole of the fourth transistor are the fourth clock signals, and the third clock signals and the fourth clock signals are two low frequency signals; wherein the second pole of the third transistor of the gate driving unit at the first level connects to the low level node, and the first control signals inputted from the gate of the third transistor are the second pulse signals, for each of the gate driving units at the first level and at the (M−3)-th through the M-th level, the second pole of the third transistor connects to the first pole of the first transistor to input the first pulse signals, and the first control signals inputted by the gate of the third transistor are the second clock signals; for each of the gate driving units at the second through the (M−4)-th level, the gate driving unit further includes an eighteenth transistor and a nineteenth transistor, wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level, the first input signals from the first pole of the fourth transistor of the gate driving unit at the current level are the fourth clock signals; and wherein for each of the gate driving units at the second through the (M−4)-th level, the second pole of the third transistor connects to the low level node, and the first control signals inputted from the gate of the third transistor are the second pulse signals.

In view of the above, the gate driving circuit includes a control module for pulling down the level of the second control node to be at the low level before the gate strobe signals are outputted and during the output period of the gate cutoff signals. In this way, the third pull-down control end of the low level maintaining module is pulled down to be at the low level before the gate strobe signals are outputted and during the output period of the gate cutoff signals such that the low level maintaining module is in the off state. Thus, the low level maintaining module is prevented from causing electrical leakage so as to decrease the output delay of the gate strobe signals from the output module.

DETAILED DESCRIPTION OF THE EMBODIMENTS

Embodiments of the invention will now be described more fully hereinafter with reference to the accompanying drawings, in which embodiments of the invention are shown.

Figure 1:
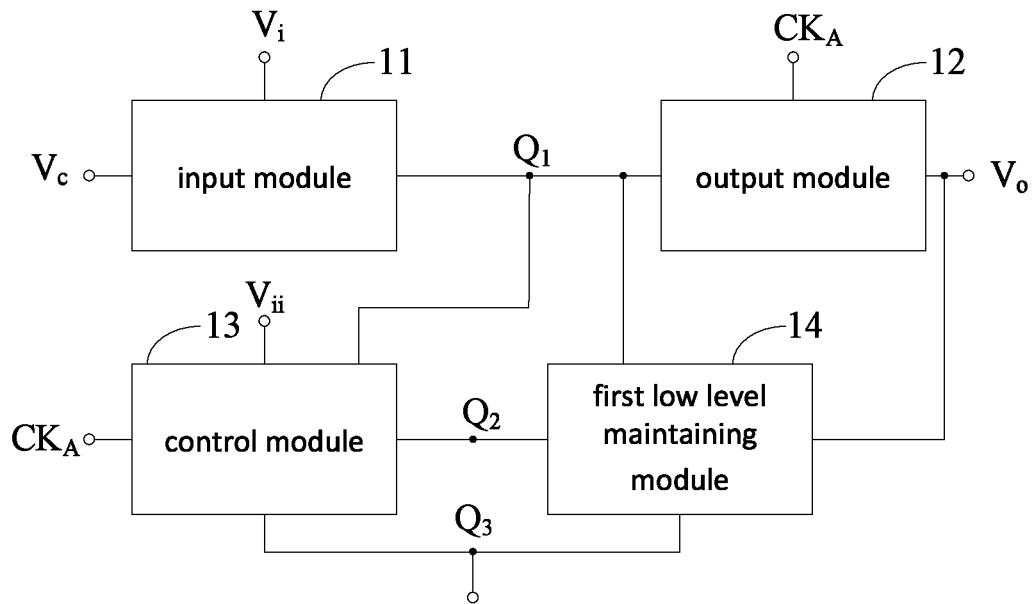
FIG. 1 is a schematic view of the gate driving unit in accordance with one embodiment.

FIG. 1 is a schematic view of the gate driving unit in accordance with one embodiment. The gate driving unit is configured for outputting scanning driving signals to one scanning line of the liquid crystal panel. The gate driving unit includes an input module 11, an output module 12, a control module 13 and a first low level maintaining module 14.

The input module 11 includes a pulse signal input end for inputting first pulse signals ($V_i$), a first pull-down control end for inputting first control signals ($V_c$) and a control signal output end coupling with a first control node ($Q_1$). The input module controls the level of the first control node ($Q_1$) in accordance with the first pulse signals ($V_i$) and the first control signals ($V_c$).

The output module 12 includes a driving control end coupling with the first control node ($Q_1$), a clock signal input end for inputting first clock signals ($CK_A$), and a output end of gate signals connecting with the scanning line of the liquid crystal panel. When being controlled by the level of the first control node ($Q_1$), the output module 12 outputs gate signals ($V_o$) via the output end of gate signals, wherein the gate signals ($V_o$) includes gate strobe signals and gate cutoff signals. The gate strobe signals relate to the high-level scanning signals turning on the thin film transistor (TFT) connected with the scanning line, and the gate cutoff signals relate to the low-level scanning signals turning off the TFT connected with the scanning line.

The control module 13 includes a clock signal input end for inputting first clock signals ($CK_A$), a first input signal end for inputting first input signals ($V_{ii}$), a second pull-down control end coupling a second control node ($Q_2$), a first control end coupling the first control node ($Q_1$), and a first pull-down end coupling with a low level node ($Q_3$). When being controlled by the high level of the first control node ($Q_1$), the control module 13 pulls down the level of the second control node ($Q_2$) to be the low level before the output module 12 outputs the gate strobe signals and during an output period of the gate cutoff signals.

Further, when being controlled by the low level signals of the first control node ($Q_1$), the control module 13 pulls up the level of the second control node ($Q_2$) to be the high level after the output module 12 outputs the gate strobe signals.

The first low level maintaining module 14 includes a third pull down control end coupling with the second control node ($Q_2$), a first end coupling with the first control node ($Q_1$), a second end coupling with the output end of the gate driving signals of the output module 12, and a third end coupling with the low level node ($Q_3$). When being controlled by the low level of second control node ($Q_2$), the first low level maintaining module 14 is in an off state before the output module 12 outputs the gate strobe signals and during an output period of the gate cutoff signals.

Further, when being controlled by the high level of the second control node ($Q_2$), the first low level maintaining module 14 is in an on state after the output module 12 outputs the gate strobe signals, such that the level of the output end of the gate signals of the output module 12 is pulled down to the low level.

In the embodiment, the level of the third pull-down control end determines whether the first low level maintaining module 14 is turned on or off. When the level of the third pull down control end is high, the first low level maintaining module 14 is turned on. The output end of the gate signals of the output module 12 couples with the low level node ($Q_3$) such that the output end of the gate signals of the output module 12 remains at the low level. When the level of the third pull down control end is low, the first low level maintaining module 14 is turned off. The control module 13 controls the level of the second control node ($Q_2$) to control the level of the third pull down control end of the first low level maintaining module 14. Before the output module 12 outputs the gate strobe signals and during the output period of the gate cutoff signals, the level of the second control node ($Q_2$) is pulled down to the low level. In this way, the third pull down control end of the first low level maintaining module 14 is pulled down to be at the low level before the output module 12 outputs the gate strobe signals and during the output period of the gate cutoff signals such that the first low level maintaining module 14 is in the off state. Thus, the electrical leakage of the first low level maintaining module 14 may be decreased so as to prevent the level of the output end of the gate signals of the output module 12 from being pulled down. Such configuration may help to decrease the output delay of the gate strobe signals outputted from the output module 12 so as to increase the efficiency. In addition, as the level of the second control node ($Q_2$) is pulled to be at the high level after the output module 12 outputs the gate strobe signals, the first low level maintaining module 14 is turned on, and the level of the output end of the gate signals of the output module 12 is pulled down to be at the low level. In this way, the TFT connected with the output end of the gate signals is prevented from being turned on, such that the signals are prevented from write error.

The gate driving unit will be described hereinafter with reference to the circuit structure.

First Embodiment

Figure 2:
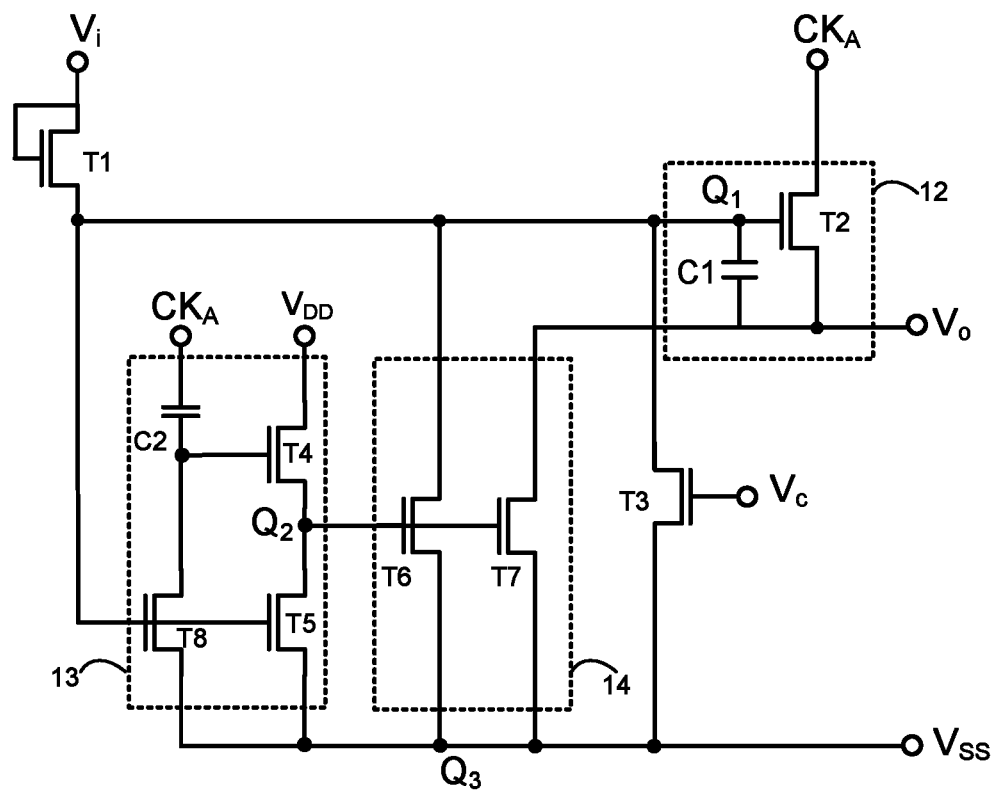
FIG. 2 is a circuit diagram of the gate driving unit in accordance with one embodiment.

Referring to FIG. 2, the input module 11 includes a first transistor (T1) and a third transistor (T3), wherein a gate of the first transistor (T1) is short-connected with a first pole to be the pulse signals input end of the input module 11 for inputting the first pulse signals ($V_i$). A second pole of the first transistor (T1) and the first pole of the third transistor (T3) connect to the first control node ($Q_1$). A second pole of the third transistor (T3) connects with the low level node ($Q_3$). A gate of the third transistor (T3) operates as a first pull down control end of the input module 11 for inputting the first control signals ($V_c$).

The output module 12 includes a second transistor (T2) and a first capacitor (C1). A gate of the second transistor (T2) operates as a driving control end of the output module 12 connecting to the first control node ($Q_1$). A first pole of the second transistor (T2) operates as the clock signal input end of the output module 12 for inputting the first clock signals ($CK_A$). A second pole of the second transistor (T2) operates as the output end of the gate signals of the output module 12. Two ends of the first capacitor (C1) respectively connects with the first control node ($Q_1$) and the second pole of the second transistor (T2).

The control module 13 includes a fourth transistor (T4), a fifth transistor (T5), an eighth transistor (T8), and a second capacitor (C2), wherein a gate of the fourth transistor (T4) and a first pole of the eighth transistor (T8) connect with one end of the second capacitor (C2). The other end of the second capacitor (C2) operates as the clock signal input end of the control module 13 for inputting the first clock signals ($CK_A$). A first pole of the fourth transistor (T4) operates as a first input signal end for inputting the first input signals. A second pole of the fourth transistor (T4) connects with a second pole of the fifth transistor (T5). The second pole of the fourth transistor (T4) operates as the second pull down control end of the control module 13 and connects with the second control node ($Q_2$). A gate of the fifth transistor (T5) connects with a gate of the eighth transistor (T8). The gate of the fifth transistor (T5) operates as the first control end of the control module 13 and connects with the first control node ($Q_1$). A second pole of the fifth transistor (T5) connects with a second pole of the eighth transistor (T8), and the second pole of the fifth transistor (T5) operates as the first pull down end of the control module 13 and connects with the low level node ($Q_3$).

The gate of the fifth transistor (T5) connects with the gate of the eighth transistor (T8). The gate of the fifth transistor (T5) operates as the first control end of the control module 13 and connects with the first control node ($Q_1$). The second pole of the fifth transistor (T5) connects with the second pole of the eighth transistor (T8). The second pole of the fifth transistor (T5) operates as the first pull down end of the control module 13 and connects to the low level node ($Q_3$).

The first low level maintaining module 14 includes a sixth transistor (T6) and a seventh transistor (T7), wherein a gate of the sixth transistor (T6) connects with a gate of the seventh transistor (T7). The gate of the sixth transistor (T6) operates as the third pull down control end of the first low level maintaining module 14 and connects to the second control node ($Q_2$). A first pole of the sixth transistor (T6) operates as a first end of the first low level maintaining module 14 connecting with the first control node ($Q_1$). A first pole of the seventh transistor (T7) operates as the second end of the first low level maintaining module 14 connecting with the second pole of the second transistor (T2). The second pole of the sixth transistor (T6) connects with the second pole of the seventh transistor (T7), and operates as the third end of the first low level maintaining module 14 connecting with the low level node ($Q_3$).

In the embodiment, the first pulse signals ($V_i$) relate to the gate signals outputted by the gate driving unit two level ahead. For instance, with respect to the 3-th gate driving unit, the first pulse signals ($V_i$) of the current level are the gate signals outputted by the gate driving unit at the first level. In other embodiments, the first pulse signals ($V_i$) may be the gate signals outputted by the gate driving unit one level ahead. Alternatively, the first pulse signals ($V_i$) may be inputted by a single signal source. The first clock signals ($CK_A$) are the high frequency clock signals, the voltage of the high level is $V_{H1}$, and the voltage of the low level is $V_{L1}$. The first control signals ($V_c$) are the second pulse signals. The high voltage source ($V_{DD}$) connects with the first pole of the fourth transistor (T4) to provide the first input signals. That is, the first input signals are the high level signals, wherein the voltage is denoted as $V_{H2}$. The low voltage source ($V_{SS}$) connects with the low level node ($Q_3$) to provide the low level signals, and the voltage is denoted as $V_L$, wherein $V_{H1} \geq V_{H2}$, and $V_L \geq V_{L1}$.

Figure 3:
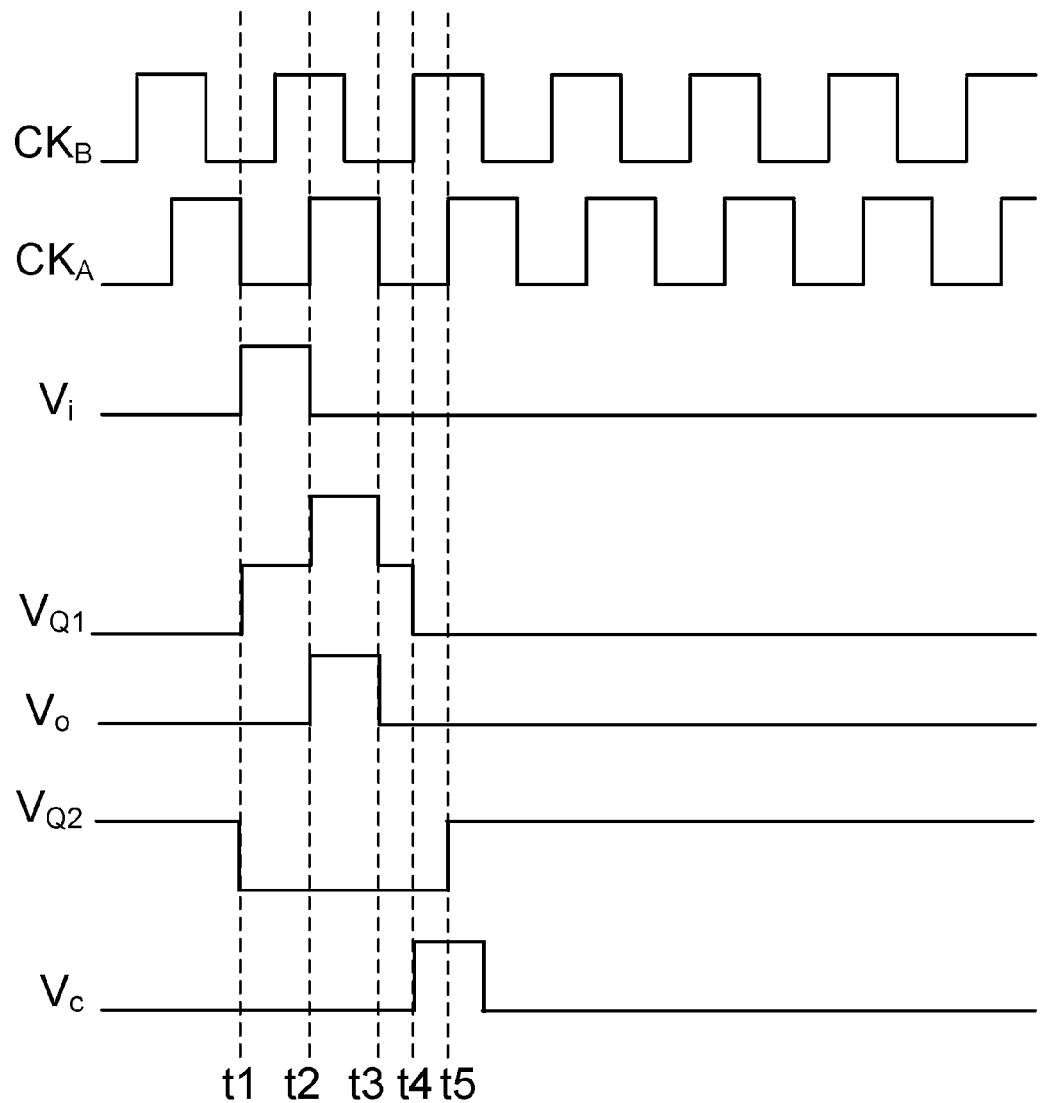
FIG. 3 is a timing diagram of the gate driving unit of FIG. 2 in accordance with one embodiment.

FIG. 3 is a timing diagram of the gate driving unit of FIG. 2 in accordance with one embodiment. In the embodiment, the operations of the gate driving unit may include two phases, including a driving phase (t1~t4) and low level maintaining phase (after t5). The liquid crystal panel is scanned along each of the rows. Thus, within one frame, the gate driving unit only outputs one high level scanning signals to the connected scanning line during the scanning operations. After the high level scanning signals are outputted, the output end of the gate driving unit has to remain at the low level signals for the rest of time so as to avoid the write error of the connected TFTs.

Specifically, at the moment t1, the first control signals ($V_c$) are at the low level such that the third transistor (T3) is turned off. The level of the first clock signals ($CK_A$) is the low level ($V_{L1}$), and the level of the first pulse signals ($V_i$) is the high level ($V_{H1}$). At this moment, the first transistor (T1) is turned on, the first pulse signals ($V_i$) charges the first control node ($Q_1$) via the first transistor (T1) such that the level ($V_{Q1}$) of the first control node ($Q_1$) is charged to be $V_{H1} - V_{TH1}$, wherein $V_{TH1}$ is the threshold voltage of the first transistor (T1). Thus, the level of the gate of the second transistor (T2) is the high level ($V_{H1} - V_{TH1}$) such that the second transistor (T2) is turned on. In this way, the gate signals ($V_o$) outputted from the second pole of the second transistor (T2) is pulled down to the low level ($V_{L1}$) of the first clock signals ($CK_A$). At this moment, as the level ($V_{Q1}$) of the first control node ($Q_1$) is the high level ($V_{H1} - V_{TH1}$), the fifth transistor (T5) and the eighth transistor (T8) are turned on. As such, the level of the gate of the fourth transistor (T4) is pulled down to be at the low level ($V_L$), and the fourth transistor (T4) is completely turned off. The turned-on fifth transistor (T5) pulls down the level ($V_{Q2}$) of the second control node ($Q_2$) to be at the low level ($V_L$) such that the sixth transistor (T6) and the seventh transistor (T7) are disconnected, and the first low level maintaining module 14 is in the off state.

At the moment t2, the first control signals ($V_c$) are at the low level. The level of the first pulse signals ($V_i$) decreased to be the low level ($V_{L1}$) to turn off the first transistor (T1). At this moment, the level ($V_{Q1}$) of the first control node ($Q_1$) remains at the high level such that the second transistor (T2)

remains in the on state. In addition, the level of the first clock signals ($CK_A$) is pulled up from the low level ($V_{L1}$) to the high level ($V_{H1}$). By charging the output end of the gate signals via the turned-on second transistor (T2), the level of the output end of the gate signals is pulled up sharply. As the first transistor (T1), the third transistor (T3), and the sixth transistor (T6) are in the off state, the first control node ($Q_1$), i.e., the gate of the second transistor (T2), is in a floating state. Thus, due to the bootstrap effect of the capacitor, the voltage of the output end of the gate signals is increased. The voltage of the first control node ($Q_1$) is increased to be higher than $V_{H1}$-$V_{TH1}$. As such, the output end of the gate signals may be quickly charged to be the high level ($V_{H1}$) so as to output the high level gate signals ($V_o$).

At the moment t3, the first clock signals ($CK_A$) drops from the high level ($V_{H1}$) to the low level ($V_{L1}$). As the level ($V_{Q1}$) of the first control node ($Q_1$) is at the high level, the second transistor (T2) is in the on state. Thus, the output end of the gate signals is discharged via the turned-on second transistor (T2). The level of the gate signals ($V_o$) outputted by the output end of the gate signals may drop to be at the low level ($V_{L1}$). Due to the bootstrap effect of the capacitor, the level ($V_{Q1}$) of the first control node ($Q_1$) drops to be $V_{H1}$-$V_{TH1}$.

At the moment t4, the first control signals ($V_c$) is pulled up from the low level to the high level, and the third transistor (T3) is turned on such that the level ($V_{Q1}$) of the first control node ($Q_1$) is pulled down to be at the low level ($V_L$) and the fifth transistor (T5) and the eighth transistor (T8) are disconnected. As the first clock signals ($CK_A$) are the low level ($V_{L1}$), the fourth transistor (T4) is in the off state such that the level ($V_{Q2}$) of the second control node ($Q_2$) remains at the low level ($V_L$).

At the moment t5, the first clock signals ($CK_A$) is pulled up from the low level ($V_{L1}$) to the high level ($V_{H1}$). By coupling a high voltage to the gate of the fourth transistor (T4) via the second capacitor (C2), the fourth transistor (T4) is turned on. The high voltage source ($V_{DD}$) charges the second control node ($Q_2$) via the turned-on fourth transistor (T4) such that the level ($V_{Q2}$) of the second control node ($Q_2$) is pulled up to be $V_{H2}$-$V_{TH4}$, wherein $V_{TH4}$ is the threshold voltage of the fourth transistor (T4). At this moment, the sixth transistor (T6) and the seventh transistor (T7) are turned on. The level ($V_{Q1}$) of the first control node ($Q_1$) is pulled down to be the low level ($V_L$) by the turned-on sixth transistor (T6). The level of the second pole of the second transistor (T2) is pulled down to be the low level ($V_L$) by the turned-on seventh transistor (T7). That is, the gate signals ($V_o$) outputted by the output end of the gate signals is pulled down to be at the low level ($V_L$).

In the embodiment, during the periods (t1~t3) of the driving phase, as the fourth transistor (T4) is completely turned off, the level ($V_{Q2}$) of the second control node ($Q_2$) may be pulled down to be the low level ($V_L$) by the turned-on fifth transistor (T5). In this way, the electrical leakage of the sixth transistor (T6) and the seventh transistor (T7) are controlled so as to decrease the delay time of the output end of the gate signals, which enhances the efficiency of the circuit.

In addition, after the output end of the gate signals outputs the high level scanning signals, the connected scanning line is in a non-strobe state. The output end of the gate signals of the gate driving unit has to be kept at the low level ($V_L$) to avoid the write error caused by the turned-on TFT connected with the corresponding scanning line. Theoretically, the level ($V_{Q1}$) of the first control node ($Q_1$), i.e., the gate of the second transistor (T2), and the gate signals ($V_o$) of the output end of the gate signals, i.e., the second pole of the second transistor (T2), have to be kept at the low level. But due to the parasitic capacitance ($C_{GD2}$) between the source and the drain of the second transistor (T2), when the first clock signals ($CK_A$) transits from the low level to the high level, a coupling voltage $\Delta V_{Q1}$ may be generated at the first control node ($Q_1$), which may result in that the first clock signals ($CK_A$) erroneously charge the output end of the gate signals and the gate signals ($V_o$) outputted by the output end of the gate signals cannot be kept at the low level. In the embodiment, after the moment t5, as the fifth transistor (T5) and the eighth transistor (T8) are in the off state, the fourth transistor (T4) may be turned on periodically along with the high level pulse period of the first clock signals ($CK_A$), and the level ($V_{Q2}$) of the second control node ($Q_2$) remains at the high level. In this way, the sixth transistor (T6) and the seventh transistor (T7) are in the on state, and the gate signals ($V_o$) outputted by the output end of the gate signals are low level scanning signals.

Figure 4:
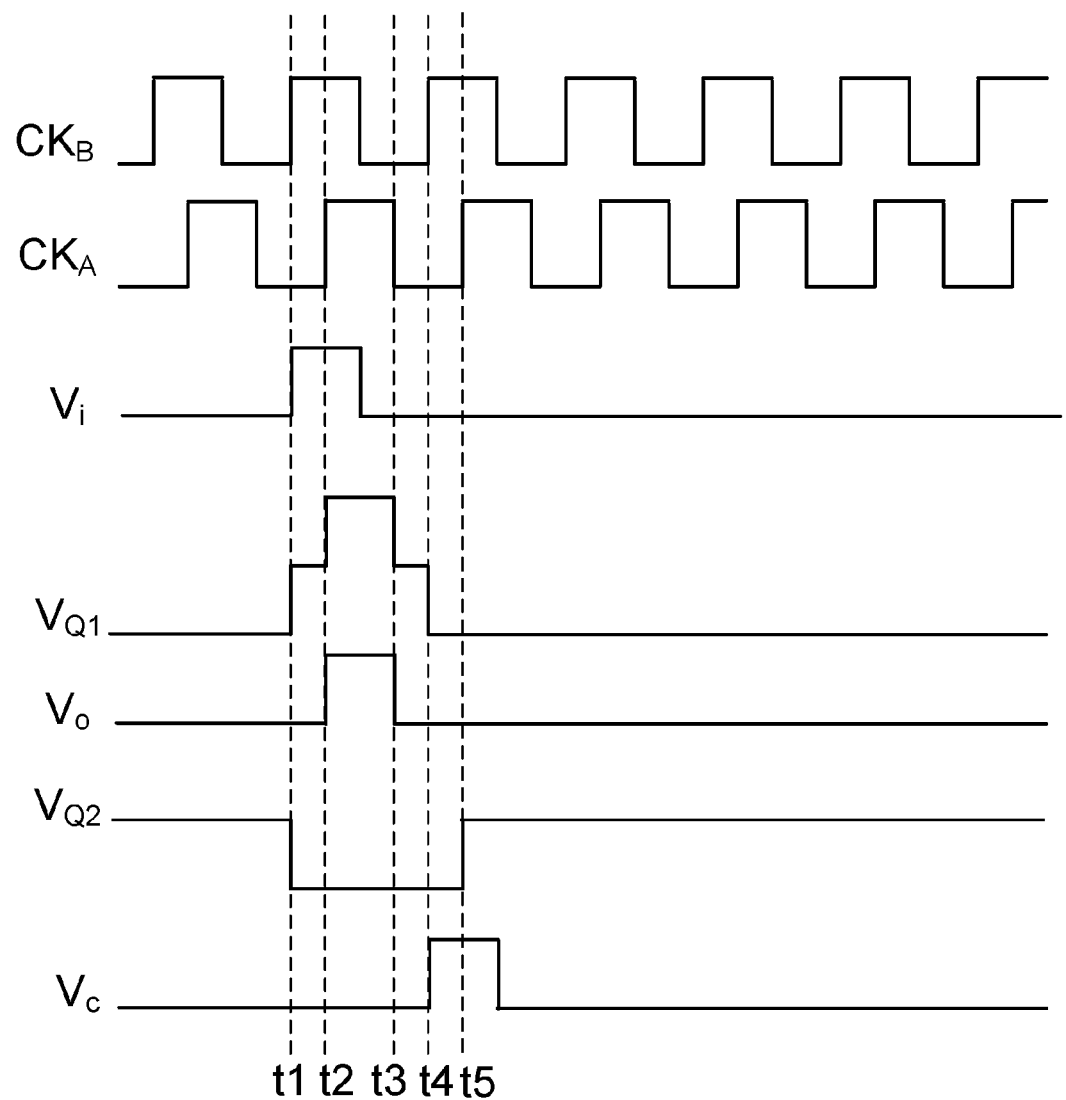
FIG. 4 is a timing diagram of the gate driving unit of FIG. 2 in accordance with another embodiment.

FIG. 4 is a timing diagram of the gate driving unit of FIG. 2 in accordance with another embodiment. The high level of the first pulse signals ($V_i$) and the low level of the first clock signals ($CK_A$) occur at the same time. The difference between the FIG. 4 and FIG. 3 resides in that, as shown in FIG. 4, the high level of the first pulse signals ($V_1$) and the high level of the first clock signals ($CK_A$) are overlapped for ¼ clock period.

As shown in FIG. 4, within the period between t2 and t3, although a portion of the first pulse signals ($V_i$) are at the high level ($V_{H1}$), as the level ($V_{Q1}$) of the first control node ($Q_1$) is sharply increased to the level higher than $V_{H1}$-$V_{TH1}$, the first transistor (T1) remains in the off state. The operations of the gate driving unit of FIG. 4 are similar to those in FIG. 3, and thus are omitted hereinafter.

Second Embodiment

Figure 5:
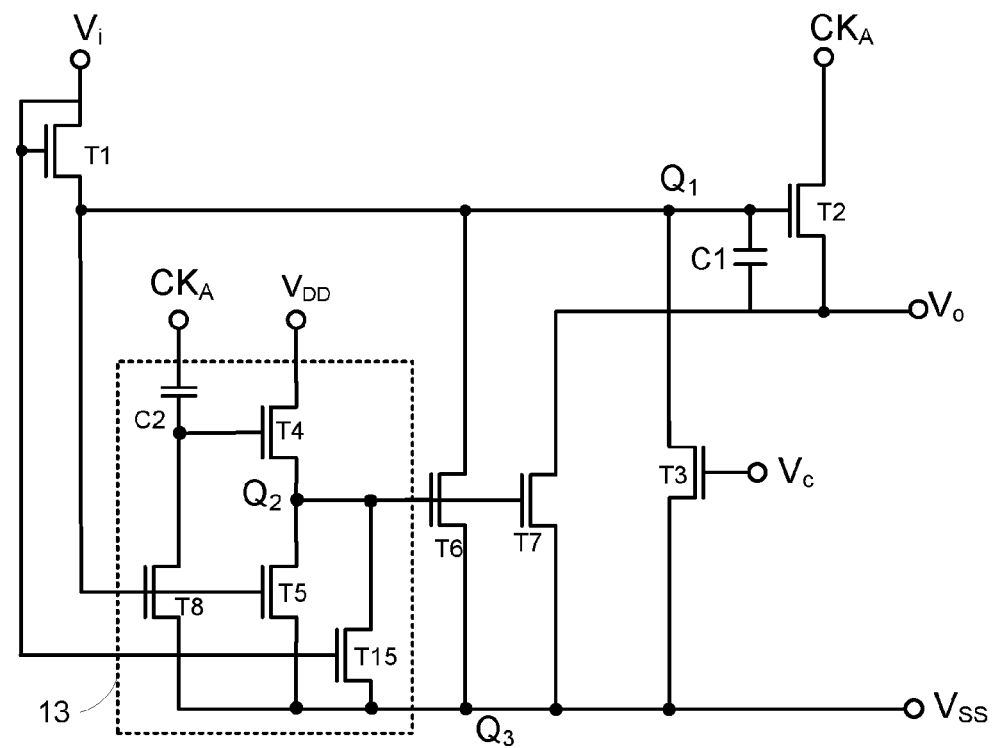
FIG. 5 is a circuit diagram of the gate driving unit in accordance with another embodiment.

FIG. 5 is a circuit diagram of the gate driving unit in accordance with another embodiment. The difference between FIG. 5 and FIG. 2 resides in that, in this embodiment, the control module 13 further includes a fifteenth transistor (T15). A gate of the fifteenth transistor (T15) connects to the gate of the first transistor (T1), a first pole of the fifteenth transistor (T15) connects to the second control node ($Q_2$), and the second pole of the fifteenth transistor (T15) connects to the low level node ($Q_3$).

The gate of the fifteenth transistor (T15) is controlled by the first pulse signals ($V_i$). By configuring the fifteenth transistor (T15), at the moment t1, the fifteenth transistor (T15) is turned on by the high level control signals of the first pulse signals ($V_i$). In this way, the level ($V_{Q2}$) of the second control node ($Q_2$) is quickly pulled down to the low level ($V_L$), which avoids the electrical leakage caused by the seventh transistor (T7) at the moment t1. Further, this may also decrease the pull-up delay time of the output signals of the second transistor (T2) so as to enhances the operations of the circuit.

Wherein the timing diagram of gate driving unit in the embodiment is similar to that of the gate driving unit in FIG. 2. Detailed operations are the same with gate driving unit in FIGS. 3 and 4, and thus are omitted hereinafter.

Third Embodiment

Figure 6:
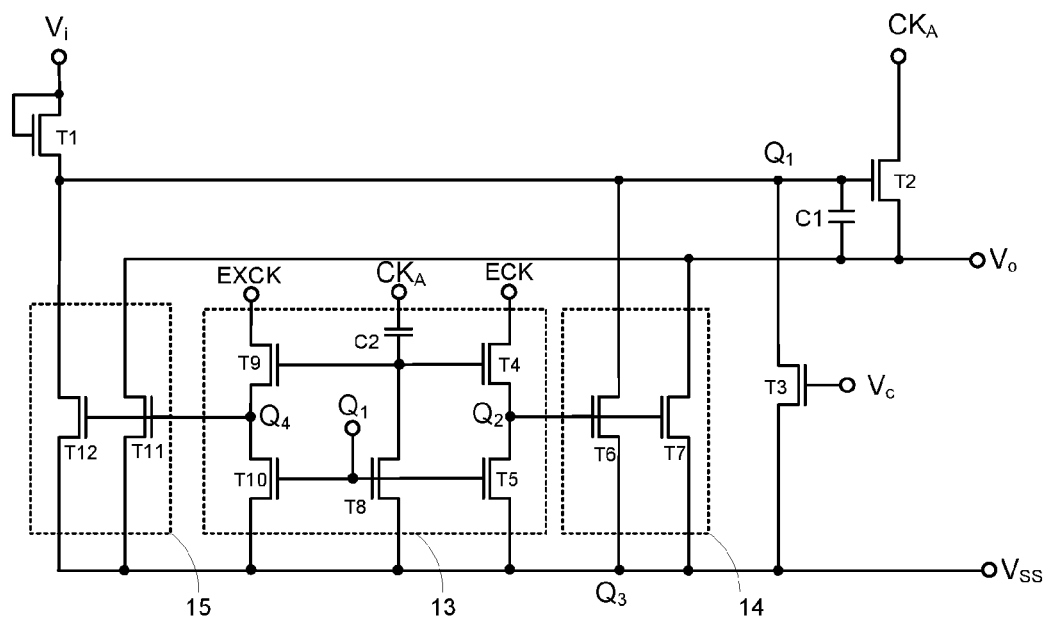
FIG. 6 is a circuit diagram of the gate driving unit in accordance with another embodiment.

FIG. 6 is a circuit diagram of the gate driving unit in accordance with another embodiment. The difference between FIG. 6 and FIG. 2 resides in that, in this embodiment, the control module 13 further includes a ninth transistor (T9) and a tenth transistor (T10). The gate driving unit further includes a second low level maintaining module 15, wherein the second low level maintaining module 15 includes an eleventh transistor (T11) and a twelevth transistor (T12).

Wherein a gate of the ninth transistor (T9) connects to the gate of the fourth transistor (T4), a first pole of ninth transistor (T9) is configured for inputting third clock signals (EXCK). A second pole of the ninth transistor (T9) connects with a first pole of the tenth transistor (T10), a gate of the eleventh transistor (T11), and a gate of the twelevth transistor (T12). The gate of the tenth transistor (T10) and the gate of the eighth transistor (T8) connect to the first control node ($Q_1$), and the second pole of the tenth transistor (T10) connects to the low level node ($Q_3$). The first pole of the eleventh transistor (T11) connects to the second pole of the second transistor (T2), i.e., the output end of the gate signals. The second pole of the eleventh transistor (T11) and the second pole of the twelevth transistor (T12) connect to the low level node ($Q_3$). The first pole of the twelevth transistor (T12) connects to the first control node ($Q_1$).

In addition, in the embodiment, the first input signals inputted by the fourth transistor (T4) are the fourth clock signals (ECK), wherein the third clock signals (EXCK) and the fourth clock signals (ECK) are two low frequency clock signals.

Referring to FIGS. 2 and 5, the sixth transistor (T6) and the seventh transistor (T7) of the first low level maintaining module 14 may be affected by DC bias stress and the threshold voltage may seriously drifts after operating for a long period of time. When the drifted amount exceeds a certain amount, the circuit may fail. The gate driving unit in the present disclosure may decrease the drifted threshold voltage of the TFT so as to enhance the reliability of the circuit.

Figure 7:
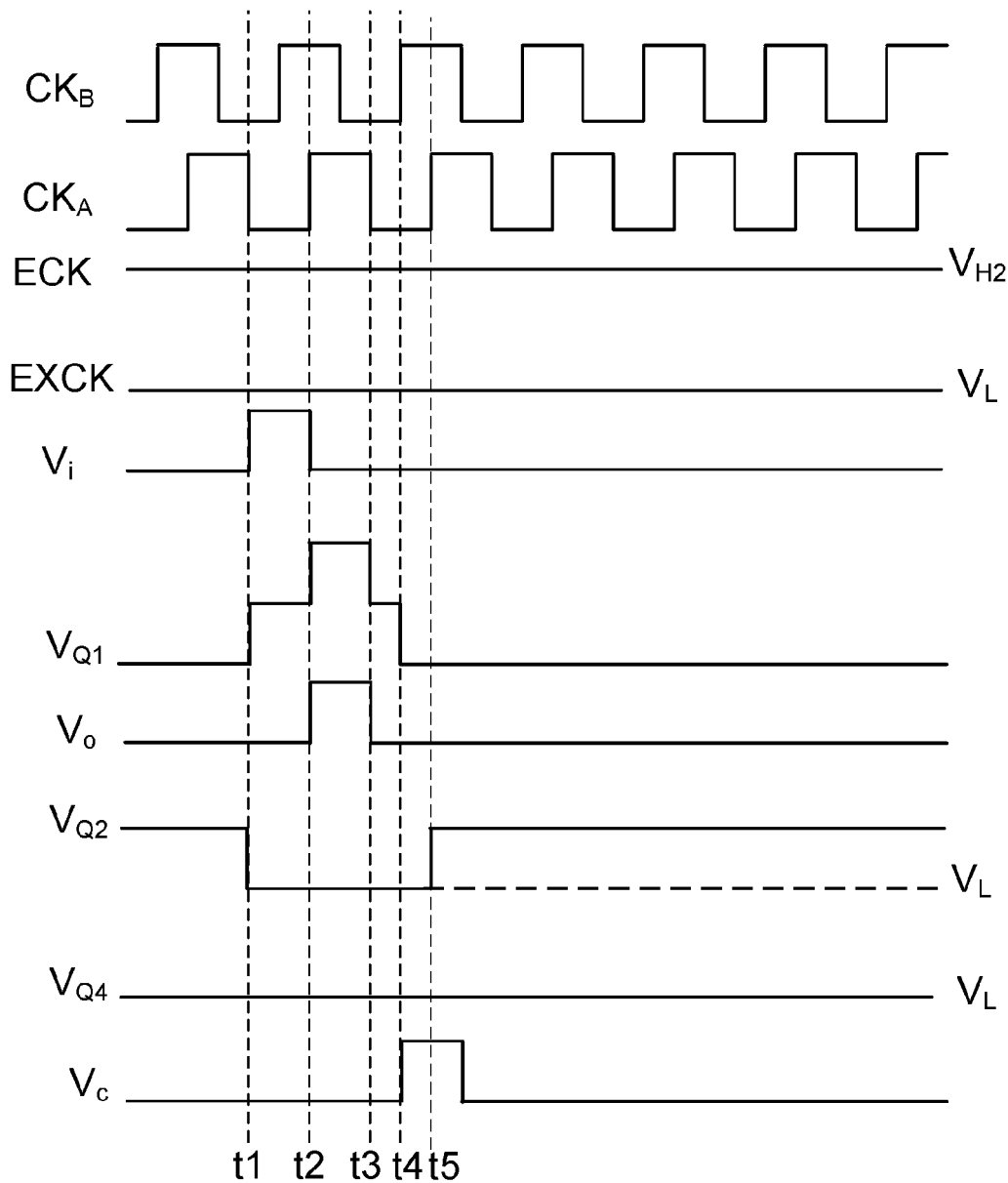
FIG. 7 is a timing diagram of the gate driving unit of FIG. 6 in accordance with one embodiment.

FIG. 7 is a timing diagram of the gate driving unit of FIG. 6 in accordance with one embodiment. Referring to FIGS. 6 and 7, the third clock signals (EXCK) are at the low level and the voltage is denoted as $V_L$, and the fourth clock signals (ECK) are at the high level and the voltage is denoted as $V_{H2}$. The high level of the first pulse signals ($V_i$) and the low level of the first clock signals ($CK_A$) arrive at the same time.

The difference between the timing diagram in FIG. 7 and the timing diagrams in FIGS. 2 and 3 will be described hereinafter. At the moment t5, the first clock signals ($CK_A$) is pulled up from the low level ($V_{L1}$) to the high level ($V_{H1}$). By coupling the high voltage with the gate of the fourth transistor (T4) via the second capacitor (C2), the fourth transistor (T4) is turned on. As the fourth clock signals (ECK) are high level signals, the fourth clock signals (ECK) charges the second control node ($Q_2$) via the fourth transistor (T4) such that the level ($V_{Q2}$) of the second control node ($Q_2$) is pulled up to be $V_{H2}-V_{TH4}$. At this moment, the sixth transistor (T6) and the seventh transistor (T7) are turned on. The level ($V_{Q1}$) of the first control node ($Q_1$) is pulled down to be the low level ($V_L$) by the turned-on sixth transistor (T6). The level of the second pole of the second transistor (T2) is pulled down to be the low level ($V_L$) by the turned-on seventh transistor (T7). That is, the gate signals ($V_o$) outputted by the output end of the gate signals is pulled down to be at the low level ($V_L$).

After the moment t5, as the fifth transistor (T5) and the eighth transistor (T8) are in the off state, the fourth transistor (T4) may be turned on periodically along with the high level pulse period of the first clock signals ($CK_A$), and the level ($V_{Q2}$) of the second control node ($Q_2$) remains at the high level. In this way, the sixth transistor (T6) and the seventh transistor (T7) are in the on state, and the gate signals ($V_o$) outputted by the output end of the gate signals are low level scanning signals. The operations of the control module 13 and the first low level maintaining module 14 may be referenced in the above descriptions and thus are omitted hereinafter.

Within the period between t1 and t3, as the level ($V_{Q2}$) of the second control node ($Q_2$) remains at the low level, the ninth transistor (T9) is turned off After the moment t4, i.e., after the second transistor (T2) outputs the gate signals ($V_o$), the level ($V_{Q1}$) of the first control node ($Q_1$) is pulled down to the low level. The fifth transistor (T5), the eighth transistor (T8), and the first liquid crystal panel 10 are disconnected. The fourth transistor (T4) and the ninth transistor (T9) is periodically turned on when being controlled by the high level of the first clock signals ($CK_A$) such that the second control node ($Q_2$) are charged to be at the high level. In this way, the sixth transistor (T6) and the seventh transistor (T7) of the first low level maintaining module 14 are in the on state so as to maintain the gate signals ($V_o$) at the low level.

As the third clock signals (EXCK) are low level signals, the second pole of the tenth transistor (T10) connects to the low level node ($Q_3$). The level ($V_{Q4}$) of the second control node ($Q_4$) is pulled down to be at the low level no matter the ninth transistor (T9) or the tenth transistor (T10) is turned on. Thus, the level ($V_{Q4}$) of the second control node ($Q_4$) remains at the low level such that the eleventh transistor (T11) and the twelevth transistor (T12) are in the off state.

According to the timing diagram in FIG. 7, the gate driving unit maintains the low level scanning signals outputted by the output end of the gate signals via the first low level maintaining module 14, and the second low level maintaining module 15 is in the off state.

Figure 8:
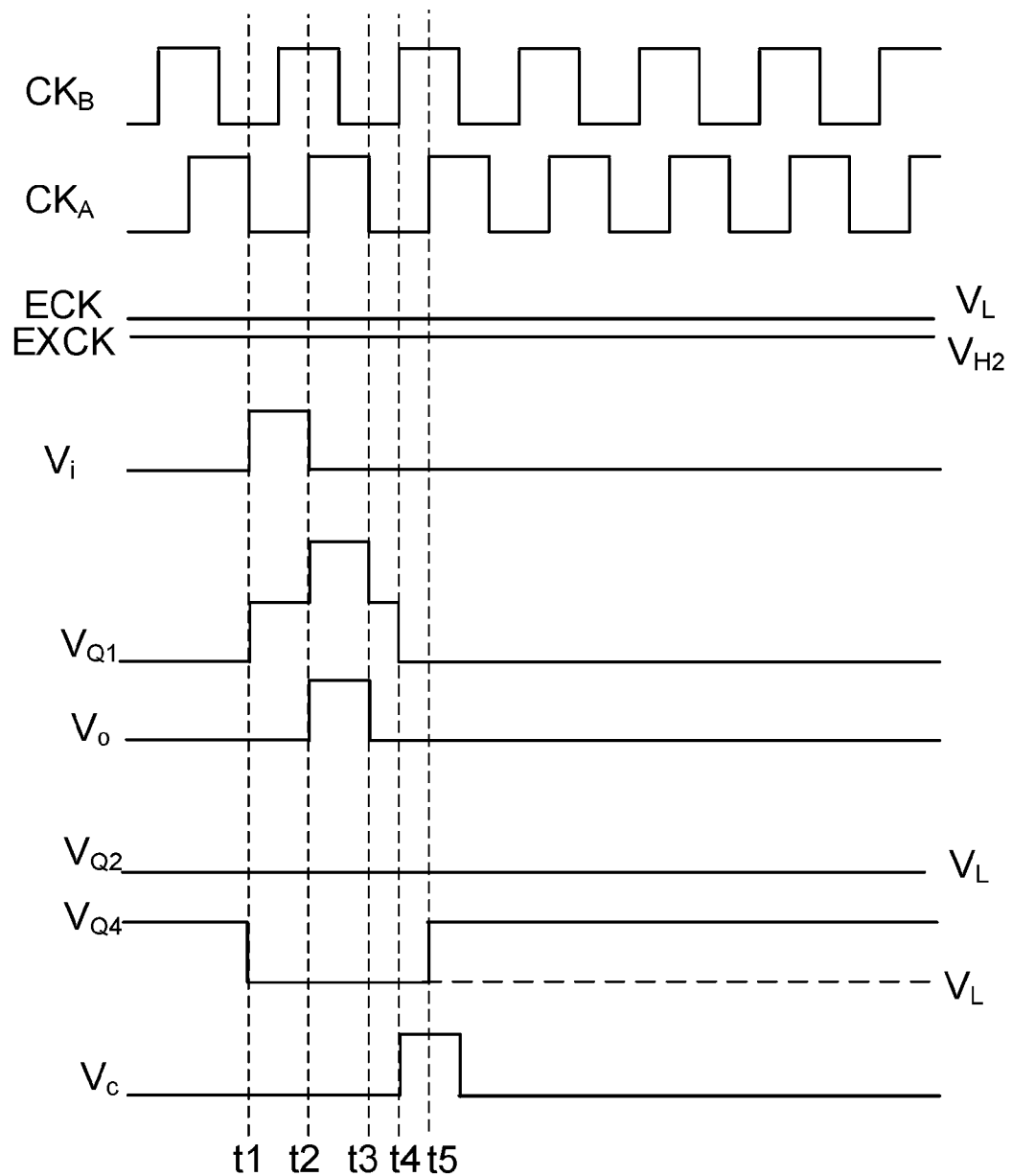
FIG. 8 is a timing diagram of the gate driving unit of FIG. 6 in accordance with another embodiment.

FIG. 8 is a timing diagram of the gate driving unit of FIG. 6 in accordance with another embodiment. Referring to FIGS. 6 and 8, the difference between the timing diagram in FIG. 8 and FIG. 7 will be described hereinafter. In FIG. 8, the third clock signals (EXCK) are at the high level and the voltage is denoted as $V_{H2}$, and the fourth clock signals (ECK) are at the low level and the voltage is denoted as $V_L$. According to FIG. 8, the gate driving unit maintains the low level scanning signals outputted by the output end of the gate signals via the second low level maintaining module 15, and the first low level maintaining module 14 is in the off state.

Specifically, as the fourth clock signals (ECK) are at the low level, and the second pole of the fifth transistor (T5) connects to the low level node ($Q_3$). The level ($V_{Q2}$) of the second control node ($Q_2$) is pulled down to the low level no matter the fourth transistor (T4) or the fifth transistor (T5) is turned on. Thus, the level ($V_{Q2}$) of the second control node ($Q_2$) remains at the low level such that the sixth transistor (T6) and the seventh transistor (T7) are in the off state. During the driving process of the circuit, the first low level maintaining module 14 is in the off state.

At the moment t1, the first control signals ($V_c$) are at the low level such that the third transistor (T3) is turned off. The level of the first clock signals ($CK_A$) is the low level ($V_{L1}$), and the level of the first pulse signals ($V_i$) is the high level ($V_{H1}$). At this moment, the first transistor (T1) is turned on, the first pulse signals ($V_i$) charges the first control node ($Q_1$) via the first transistor (T1) such that the level ($V_{Q1}$) of the first control node ($Q_1$) is charged to be $V_{H1}-V_{TH1}$, wherein $V_{TH1}$ is the threshold voltage of the first transistor (T1). Thus, the level of the gate of the second transistor (T2) is the high level ($V_{H1}-V_{TH1}$) such that the second transistor (T2)

is turned on. In this way, the gate signals ($V_o$) outputted from the second pole of the second transistor (T2) is pulled down to the low level ($V_{L1}$) of the first clock signals ($CK_A$). At this moment, as the level ($V_{Q1}$) of the first control node ($Q_1$) is the high level ($V_{H1}-V_{TH1}$), the eighth transistor (T8) and the tenth transistor (T10) are turned on. As such, the level of the gate of the ninth transistor (T9) is pulled down to be at the low level ($V_L$), and the ninth transistor (T9) is completely turned off. The turned-on tenth transistor (T10) pulls down the level ($V_{Q4}$) of the fourth control node ($Q_4$) to be at the low level ($V_L$) such that the eleventh transistor (T11) and the twelevth transistor (T12) are disconnected, and the second low level maintaining module 15 is in the off state.

At the moment t2, the first control signals ($V_c$) are at the low level. The level of the first pulse signals ($V_i$) decreased to be the low level ($V_{L1}$) to turn off the first transistor (T1). At this moment, the level ($V_{Q1}$) of the first control node ($Q_1$) remains at the high level such that the second transistor (T2) remains in the on state. In addition, the level of the first clock signals ($CK_A$) is pulled up from the low level ($V_{L1}$) to the high level ($V_{H1}$). By charging the output end of the gate signals via the turned-on second transistor (T2), the level of the output end of the gate signals is pulled up sharply. As the first transistor (T1), the third transistor (T3), the sixth transistor (T6), and the twelevth transistor (T12) are in the off state, the first control node ($Q_1$), i.e., the gate of the second transistor (T2), is in a floating state. Thus, due to the bootstrap effect of the capacitor, the voltage of the output end of the gate signals is increased. The voltage of the first control node ($Q_1$) is increased to be higher than $V_{H1}-V_{TH1}$. As such, the output end of the gate signals may be quickly charged to be the high level ($V_{H1}$) so as to output the high level gate signals ($V_o$).

At the moment t3, the first clock signals ($CK_A$) drops from the high level ($V_{H1}$) to the low level ($V_{L1}$). As the level ($V_{Q1}$) of the first control node ($Q_1$) is at the high level, the second transistor (T2) is in the on state. Thus, the output end of the gate signals is discharged via the turned-on second transistor (T2). The level of the gate signals ($V_o$) outputted by the output end of the gate signals may drop to be at the low level ($V_{L1}$). Due to the bootstrap effect of the capacitor, the level ($V_{Q1}$) of the first control node ($Q_1$) drops to be $V_{H1}-V_{TH1}$.

At the moment t4, the first control signals ($V_c$) is pulled up from the low level to the high level, and the third transistor (T3) is turned on such that the level ($V_{Q1}$) of the first control node ($Q_1$) is pulled down to be at the low level ($V_L$) and the eighth transistor (T8) and the tenth transistor (T10) are disconnected. As the first clock signals ($CK_A$) are the low level ($V_{L1}$), the ninth transistor (T9) is in the off state such that the level ($V_{Q4}$) of the second control node ($Q_4$) remains at the low level ($V_L$).

At the moment t5, the first clock signals ($CK_A$) is pulled up from the low level ($V_{L1}$) to the high level ($V_{H1}$). By coupling a high voltage to the gate of the ninth transistor (T9) via the second capacitor (C2), the ninth transistor (T9) is turned on. As the third clock signals (EXCK) are high level signals, the third clock signals (EXCK) charges the fourth control node ($Q_4$) via the ninth transistor (T9) such that the level ($V_{Q2}$) of the second control node ($Q_2$) is pulled up to be $V_{H2}-V_{TH9}$, wherein $V_{TH9}$ relates to the threshold voltage of the ninth transistor (T9). At this moment, the eleventh transistor (T11) and the twelevth transistor (T12) are turned on. The turned-on twelevth transistor (T12) pulls down the level ($V_{Q1}$) of the first control node ($Q_1$) to be at the low level ($V_L$). The level of the second pole of the second transistor (T2) is pulled down to be at the low level ($V_L$) by the turned-on eleventh transistor (T11). That is, the gate signals ($V_o$) outputted by the output end of the gate signals are pulled down to be at the low level ($V_L$).

After the moment t5, as the eighth transistor (T8) and the tenth transistor (T10) are in the off-state, the ninth transistor (T9) may be turned on periodically along with the high level pulse period of the first clock signals ($CK_A$), and the level ($V_{Q4}$) of the second control node ($Q_4$) remains at the high level. In this way, the eleventh transistor (T11) and the twelevth transistor (T12) are in the on state, and the gate signals ($V_o$) outputted by the output end of the gate signals are low level scanning signals.

With such configuration, as the clock signals (EXCK, ECK) are continuously switched, and the TFTs within the first low level maintaining module 14 and the second low level maintaining module 15 operate in an alternated manner. In an example, the third clock signals (EXCK) are at the low level, and the fourth clock signals (ECK) are at the high level. Referring to FIG. 7, the TFTs within the first low level maintaining module 14 in an operational state keep the output end of the gate signals at low level, and the TFTs within the second low level maintaining module 15 are in the off state. At the next moment, the third clock signals (EXCK) are switched to be at the high level, and the fourth clock signals (ECK) are switched to be at the low level. Referring to FIG. 8, the TFTs within the second low level maintaining module 15 in the operational state keep the output end of the gate signals at low level, and the TFTs within the second low level maintaining module 15 are in the off state, and the TFTs within the second low level maintaining module 15 are in the off state. In this way, the first low level maintaining module 14 and the second low level maintaining module 15 operate in the alternated manner, which prevents the TFTs within one module from operating for a long time period. This controls the threshold voltage drifting of the TFTs so as to extend the life cycle of the circuit. In addition, the two low level maintaining modules 14, 15 share one control module 13 so as to save the dimension of the circuit.

The Fourth Embodiment

Figure 9:
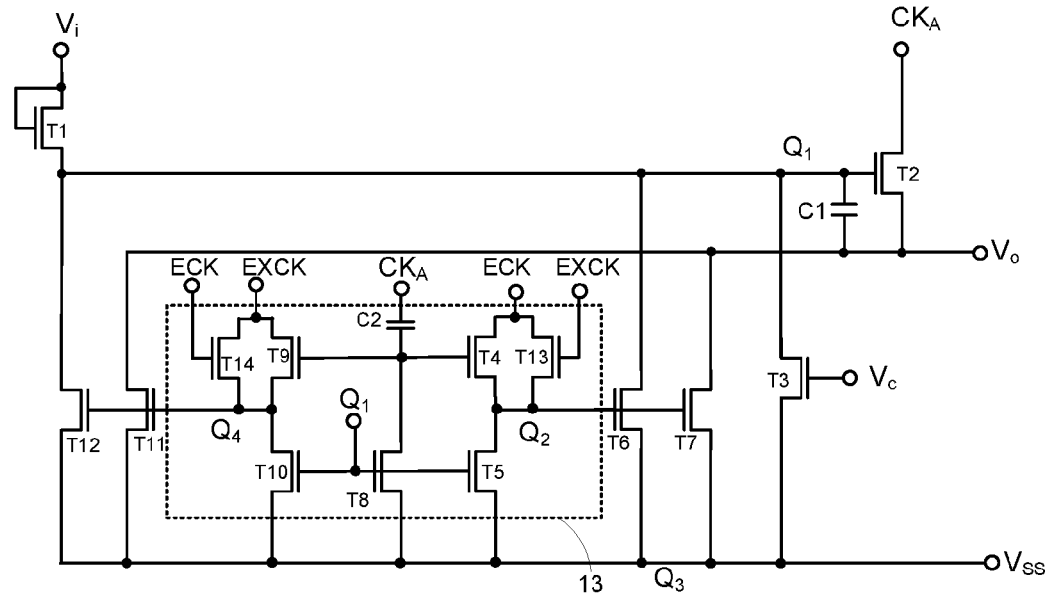
FIG. 9 is a circuit diagram of the gate driving unit in accordance with another embodiment.

FIG. 9 is a circuit diagram of the gate driving unit in accordance with another embodiment. The timing diagram of the gate driving unit in the embodiment is the same with the timing diagram in FIG. 6. The difference between FIG. 9 and FIG. 6 resides in that, in this embodiment, the control module 13 further includes a ninth transistor (T9) and a tenth transistor (T10). The gate driving unit further includes a thirteenth transistor (T13) and a fourteenth transistor (T14).

Wherein a gate of the thirteenth transistor (T13) is configured for inputting the third clock signals (EXCK), a first pole of the thirteenth transistor (T13) connects to the first pole of the fourth transistor (T4) for inputting the fourth clock signals (ECK). A second pole of the thirteenth transistor (T13) connects to the second control node ($Q_2$). A gate of the fourteenth transistor (T14) is configured for inputting the fourth clock signals (ECK). A first pole of the fourteenth transistor (T14) connects to the first pole of the ninth transistor (T9) for inputting the third clock signals (EXCK). A second pole of the fourteenth transistor (T14) connects to the fourth control node ($Q_4$).

In the embodiment, by configuring the thirteenth transistor (T13) and the fourteenth transistor (T14), when the gate driving unit operates in accordance with the timing diagram in FIG. 7, the sixth transistor (T6) and the seventh transistor (T7) maintains the low level of the output end of the gate signals. At this moment, the fourteenth transistor (T14) is in the on state. By coupling the third clock signals (EXCK) with the fourth control node ($Q_4$) via the fourteenth transistor (T14), the low level of the fourth control node ($Q_4$) may be stably maintained so as to avoid the electrical leakage of the eleventh transistor (T11) and the twelevth transistor (T12) due to the unstable low level of fourth control node ($Q_4$). When the gate driving unit operates in accordance with the timing diagram of FIG. 8, the eleventh transistor (T11) and the twelevth transistor (T12) maintains the low level of the output end of the gate signals. At this moment, the thirteenth transistor (T13) is in the on state. By coupling the fourth clock signals (ECK) with the second control node ($Q_2$) via the turned-on thirteenth transistor (T13), the low level of the second control node ($Q_2$) may be stably maintained to avoid the electrical leakage of the sixth transistor (T6) and the seventh transistor (T7) due to the unstable low level of second control node ($Q_2$).

Fifth Embodiment

Figure 10:
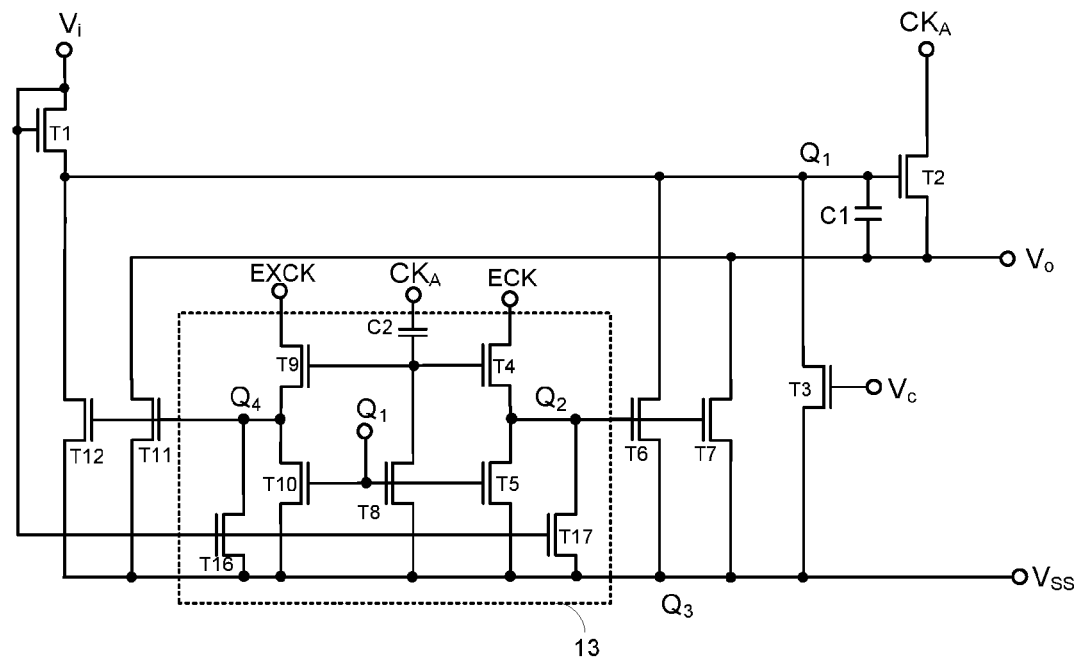
FIG. 10 is a circuit diagram of the gate driving unit in accordance with another embodiment.

FIG. 10 is a circuit diagram of the gate driving unit in accordance with another embodiment. The timing diagram of the gate driving unit in the embodiment is the same with the timing diagram in FIG. 6. The difference between FIG. 10 and FIG. 6 resides in that, in this embodiment, the control module 13 further includes a sixteenth transistor (T16) and a seventeenth transistor (T17).

A gate of the sixteenth transistor (T16) and a gate of the seventeenth transistor (T17) connects to the gate of the first transistor (T1) for inputting the first pulse signals ($V_i$). A first pole of the sixteenth transistor (T16) connects to the fourth control node ($Q_4$), and a second pole of the sixteenth transistor (T16) connects to the low level node ($Q_3$). A first pole of the seventeenth transistor (T17) connects to the second control node ($Q_2$), and a second pole of the seventeenth transistor (T17) connects to the low level node ($Q_3$).

The sixteenth transistor (T16) and the seventeenth transistor (T17) are driven by the first pulse signals ($V_i$). By configuring the sixteenth transistor (T16) and the seventeenth transistor (T17), the gate driving unit operates in accordance with the timing diagram in FIG. 7. At the moment t1, the turned-on seventeenth transistor (T17) quickly pulls down the gates of the sixth transistor (T6) and the seventh transistor (T7) to the low level ($V_L$) to avoid the electrical leakage caused by the sixth transistor (T6) and seventh transistor (T7), which decreases the output pull-up delay of the circuit. When operating in accordance with the timing diagram of FIG. 8, at the moment t1, the gates of the eleventh transistor (T11) and the twelevth transistor (T12) are quickly pulled down to be at the low level ($V_L$) by the turned-on sixteenth transistor (T16) so as to avoid the electrical leakage caused by the eleventh transistor (T11) and the twelevth transistor (T12) at the moment t1. As such, the output pull-up delay of the circuit may be decreased.

Sixth Embodiment

Figure 11:
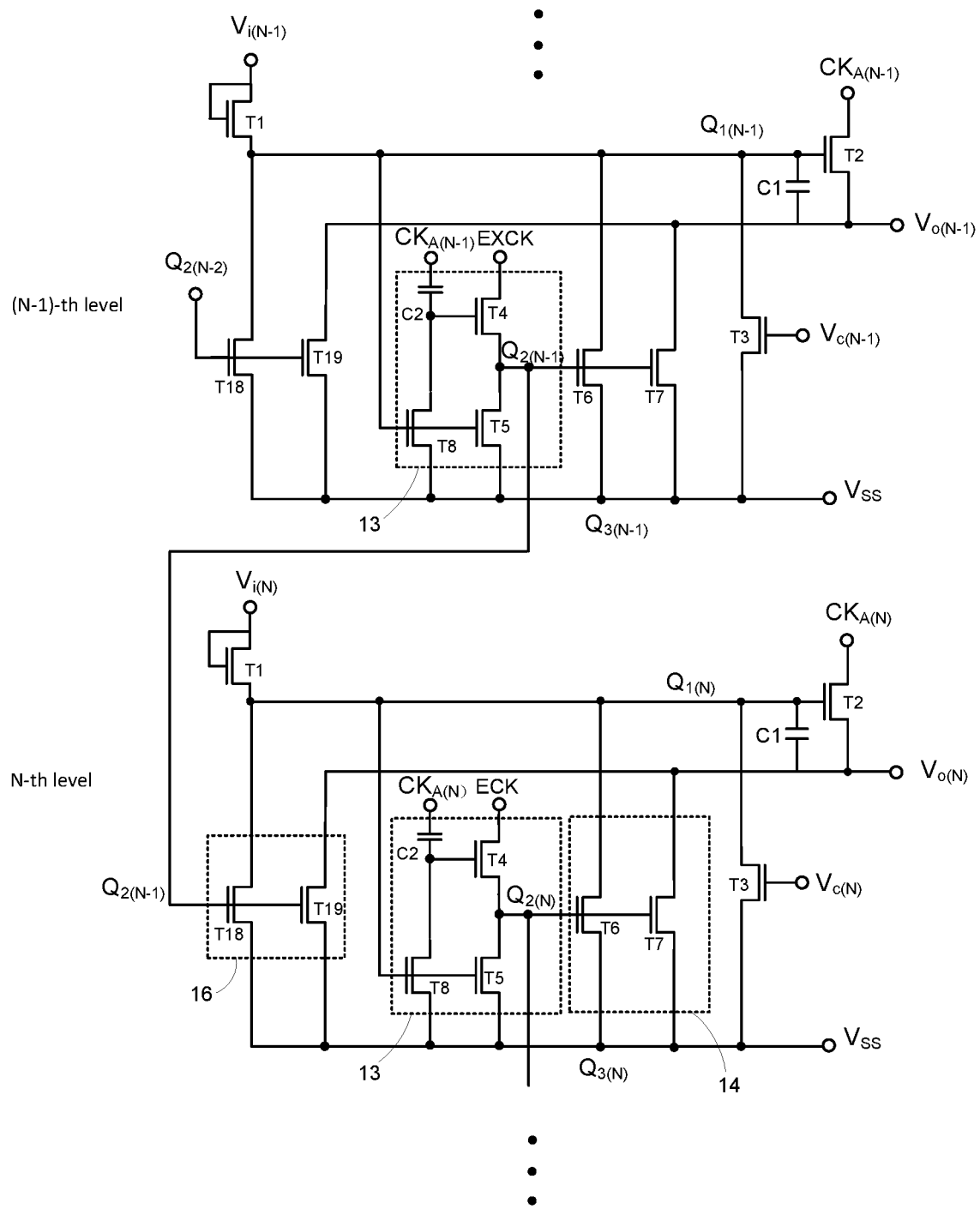
FIG. 11 is a circuit diagram of the gate driving unit in accordance with another embodiment.

FIG. 11 is a circuit diagram of the gate driving unit in accordance with another embodiment. Each of the gate driving units is configured for driving one scanning line. Thus, the liquid crystal panel is configured with a plurality of gate driving units connected in a cascaded manner. The output end of the gate signals of each of the gate driving units connects with one scanning line.

The difference between FIG. 11 and FIG. 2 resides in that, the gate driving unit further includes a second low level maintaining module 16 including an eighteenth transistor (T18) and a nineteenth transistor (T19).

In an example, the current gate driving unit is at the N-th level, and the previous gate driving unit is at the (N−1)-th level. As shown in FIG. 11, when the gates of the eighteenth transistor (T18) and the nineteenth transistor (T19) of the current gate driving unit connect to the second control node ($Q_2$) of the previous gate driving unit. A first pole of the eighteenth transistor (T18) of the previous gate driving unit connects to the first control node ($Q_1$) of the current gate driving unit, and a second pole of the eighteenth transistor (T18) of the previous gate driving unit connects to the low level node ($Q_3$) of the current gate driving unit. A first pole of the nineteenth transistor (T19) of the previous gate driving unit connects to the second pole of the second transistor (T2) of the current gate driving unit, and a second pole of the nineteenth transistor (T19) of the current gate driving unit connects to the low level node ($Q_3$) of the current gate driving unit.

The first input signals from the first pole of the fourth transistor (T4) of the current gate driving unit are the fourth clock signals (ECK). The first input signals from the first pole of the fourth transistor (T4) of the previous gate driving unit are the third clock signals (EXCK). In the embodiment, the gate driving units operate in a similar manner with the gate driving units in FIG. 6. The difference resides in that the second low level maintaining module 16 of the gate driving unit is driven by the second control node of the previous gate driving unit.

Figure 12:
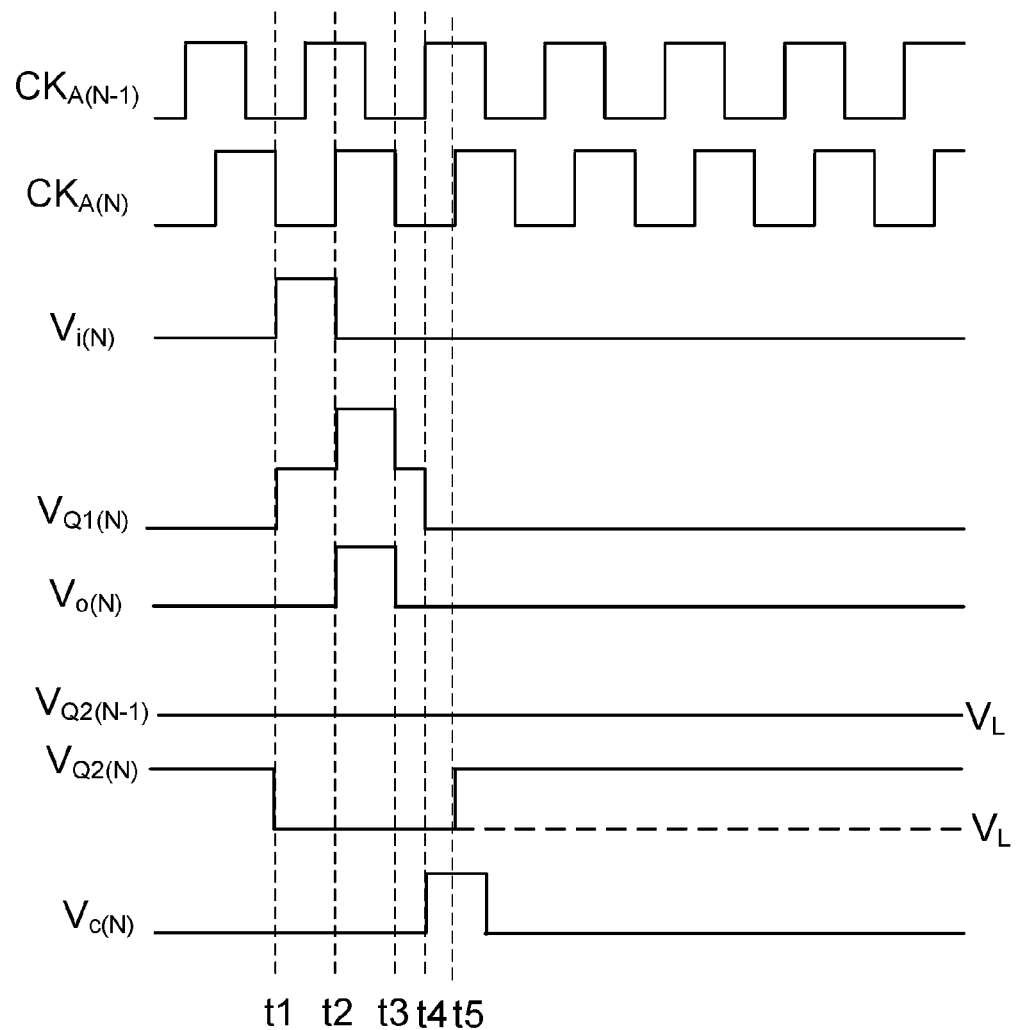
FIG. 12 is a timing diagram of the gate driving unit of FIG. 11 in accordance with one embodiment.

FIG. 12 is a timing diagram of the gate driving unit of FIG. 11 in accordance with one embodiment. The high level of the first pulse signals ($V_i$) and the low level of the first clock signals ($CK_A$) occur at the same time. The third clock signals (EXCK) are at the low level and the voltage is denoted as $V_L$, the fourth clock signals (ECK) are at the high level and the voltage is denoted as $V_{H2}$. Under the circumstance, the operations of the previous gate driving unit are similar to the operations of the gate driving unit in FIG. 6, and thus are omitted hereinafter. The level ($V_{Q2(N-1)}$) of the second control node ($Q_{2(N-1)}$) of the previous gate driving unit (N−1) is pulled down to be at the low level ($V_L$) by the turned-on fifth transistor (T5) or fourth transistor (T4). That is, the level ($V_{Q2(N-1)}$) of the second control node ($Q_{2(N-1)}$) of the previous gate driving unit is maintained at the low level ($V_L$) by the low level from the output end of the gate signals corresponding to the second low level maintaining module 16, and the first low level maintaining module 14 is in the off state when being controlled by the low level of the second control node ($Q_{2(N-1)}$).

With respect to the current gate driving unit (N), the fourth clock signals (ECK) are high level, and the operations of the current gate driving unit are similar with the gate driving unit in FIG. 6, and thus are omitted hereinafter. The gates of the eighteenth transistor (T18) and the nineteenth transistor (T19) connects to the second control node ($Q_{2(N-1)}$) of the current gate driving unit (N−1). When being controlled by the low level of the second control node ($Q_{2(N-1)}$) of the previous gate driving unit (N−1), the eighteenth transistor (T18) and the nineteenth transistor (T19) of the current gate driving unit (N) are in the off state. Thus, the second low level maintaining module 16 of the current gate driving unit (N) is in the off state. At the moment t5, when the level ($V_{Q2(N)}$) of the second control node ($Q_{2(N)}$) of the current gate driving unit (N) remains at the high level, the sixth transistor (T6) and the seventh transistor (T7) are in the on state so as to maintain the gate signals ($V_{o(N)}$) from the output end of the gate signals to be at the low level. That is, the current gate driving unit (N) maintains the output end of the gate signals to be at the low level by the first low level maintaining module 14, and the second low level maintaining module 16 is in the off state.

In the above example, the third clock signals (EXCK) are at the low level, and the fourth clock signals (ECK) are at the high level. The previous gate driving unit (N−1) maintains the output end of the gate signals to be at the low level by the second low level maintaining module 16, and the current gate driving unit (N) maintains the output end of the gate signals to be at the low level by the first low level maintaining module 14. In another example, the third clock signals (EXCK) are at the high level, and the fourth clock signals (ECK) are at the low level. The previous gate driving unit (N−1) maintains the output end of the gate signals to be at the low level by the first low level maintaining module 14, and the current gate driving unit (N) maintains the output end of the gate signals to be at the low level by the second low level maintaining module 16. The detailed process may be referenced in the above disclosure, and thus are omitted hereinafter.

Figure 13:
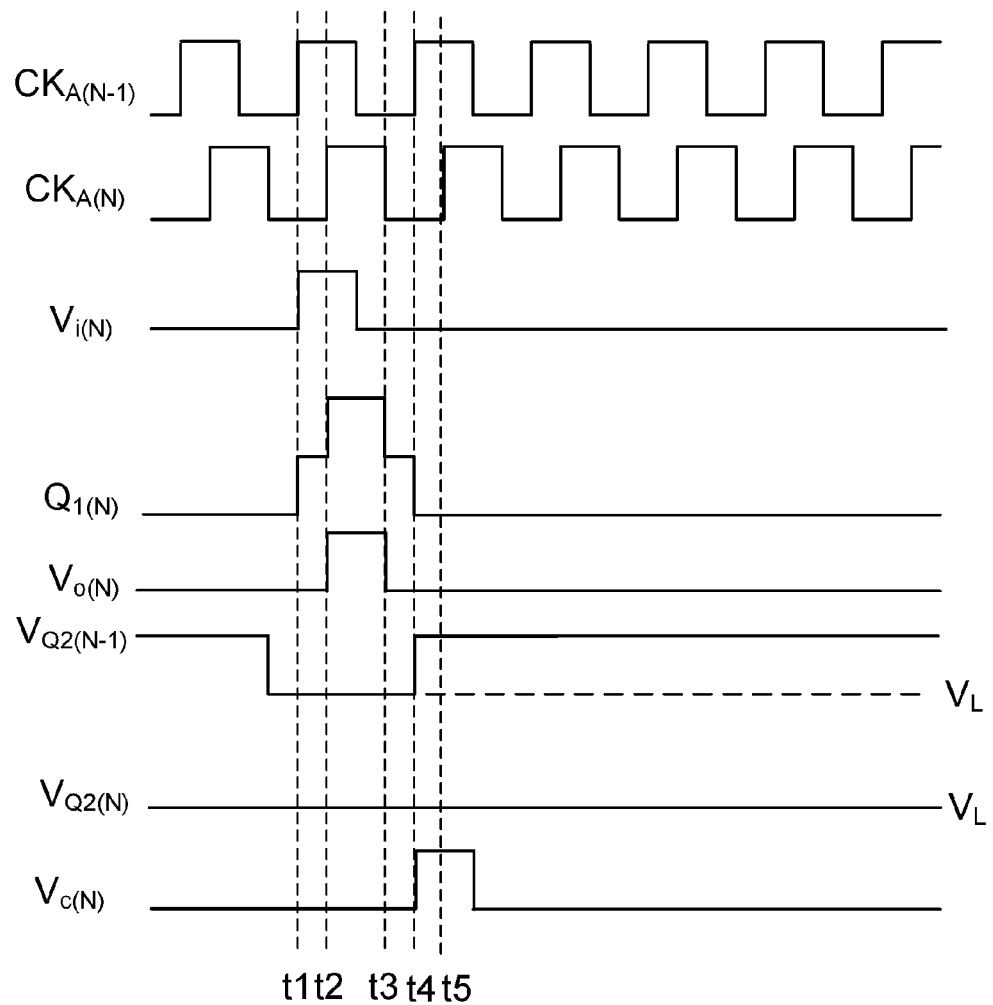
FIG. 13 is a timing diagram of the gate driving unit of FIG. 11 in accordance with another embodiment.

FIG. 13 is a timing diagram of the gate driving unit of FIG. 11 in accordance with another embodiment. The high level of the first pulse signals ($V_{i(N)}$) and the high level of the first clock signals ($CK_{A(N)}$) are overlapped for ¼ clock period. The third clock signals (EXCK) are at the high level and the voltage is denoted as $V_{H2}$, and the fourth clock signals (ECK) are at the high level and the voltage is denoted as $V_L$. In the example, the operations of the previous gate driving unit (N−1) are similar to the gate driving unit in FIG. 6, and thus are omitted hereinafter. After the moment t5, the fifth transistor (T5) and the eighth transistor (T8) of the previous gate driving unit (N−1) are in the off state. The fourth transistor (T4) may be turned on periodically along with the high level pulse period of the first clock signals ($CK_{A(N-1)}$), and the level ($V_{Q2(N-1)}$) of the second control node ($Q_{2(N-1)}$) remains at the high level ($V_{H2}$). That is, the previous gate driving unit (N−1) maintains the output end of the gate signals to be at the low level by the first low level maintaining module 14, and the second low level maintaining module 16 is in the off state. With respect to the current gate driving unit (N), the fourth clock signals (ECK) are the low level, and the operations of the current gate driving unit are similar with the gate driving unit in FIG. 6, and thus are omitted hereinafter. The level ($V_{Q2(N)}$) of the second control node ($Q_{2(N)}$) of the current gate driving unit (N) is pulled down to be at the low level ($V_L$) by the turned-on fifth transistor (T5) or fourth transistor (T4). That is, the second control node ($Q_{2(N)}$) of the current gate driving unit (N) is maintained at the low level ($V_L$), the sixth transistor (T6) and the seventh transistor (T7) are in the off state. Thus, the first low level maintaining module 14 is in the off state. After the moment t5, when being controlled by the high level of the second control node ($Q_{2(N-1)}$) of the previous gate driving unit (N−1), the eighteenth transistor (T18) and the nineteenth transistor (T19) of the current gate driving unit (N) are in the on state. Thus, the second low level maintaining module 16 of the current gate driving unit (N) is in the on state. In addition, the gate signals ($V_{o(N)}$) from the output end of the gate signals are maintained at the low level. That is, the current gate driving unit (N) maintains the output end of the gate signals are maintained at the low level by the second low level maintaining module 16, and the first low level maintaining module 14 is in the off state.

In the above example, the third clock signals (EXCK) are at the high level, and the fourth clock signals (ECK) are at the low level. The previous gate driving unit (N−1) maintains the output end of the gate signals to be at the low level by the first low level maintaining module 14, and the current gate driving unit (N) maintains the output end of the gate signals to be at the low level by the second low level maintaining module 16. In another example, the third clock signals (EXCK) are at the low level, and the fourth clock signals (ECK) are at the high level.

The previous gate driving unit (N−1) maintains the output end of the gate signals to be at the low level by the second low level maintaining module 16, and the current gate driving unit (N) maintains the output end of the gate signals to be at the low level by the first low level maintaining module 14. The detailed process may be referenced in the above disclosure, and thus are omitted hereinafter.

With such configuration, two adjacent gate driving units share the same control module. Specifically, the current gate driving unit (N) and the previous gate driving unit (N−1) share the same control module to reduce the number of the TFTs within the circuit. This not only simplifies the circuit design, but also decreases the dimension of the circuit.

In other embodiments, the control module of the gate driving unit of FIG. 11 may further include the fifteenth transistor (T15). The connection method of the fifteenth transistor (T15) may be referred to that in FIG. 5, and thus is omitted hereinafter.

Seventh Embodiment

Figure 14:
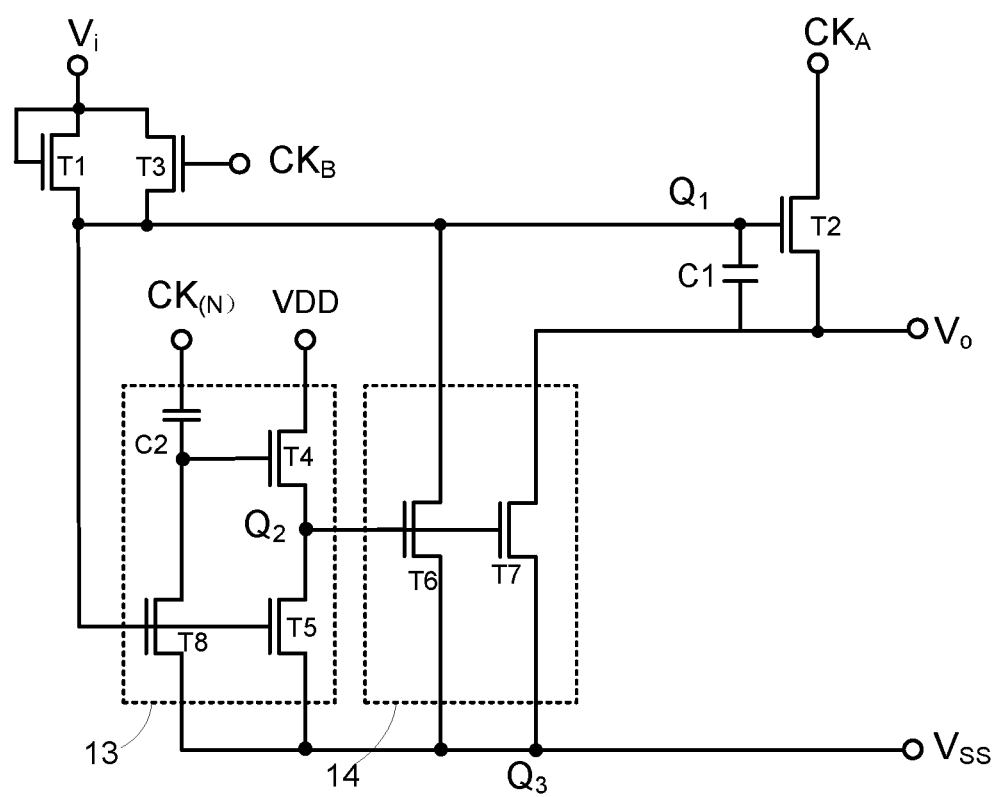
FIG. 14 is a circuit diagram of the gate driving unit in accordance with another embodiment.

FIG. 14 is a circuit diagram of the gate driving unit in accordance with another embodiment. The difference between FIGS. 14 and 2 resides in that: the second pole of the third transistor (T3) connects to the gate of the first transistor (T1) for inputting the first pulse signals ($V_i$). The first control signals inputted from the gate of the third transistor (T3) are the second clock signals ($CK_B$), wherein the high level of the first clock signals ($CK_A$) and the high level of the second clock signals ($CK_B$) overlap for ¼ clock period, and the second clock signals ($CK_B$) are the first clock signals of the previous gate driving unit.

Figure 15:
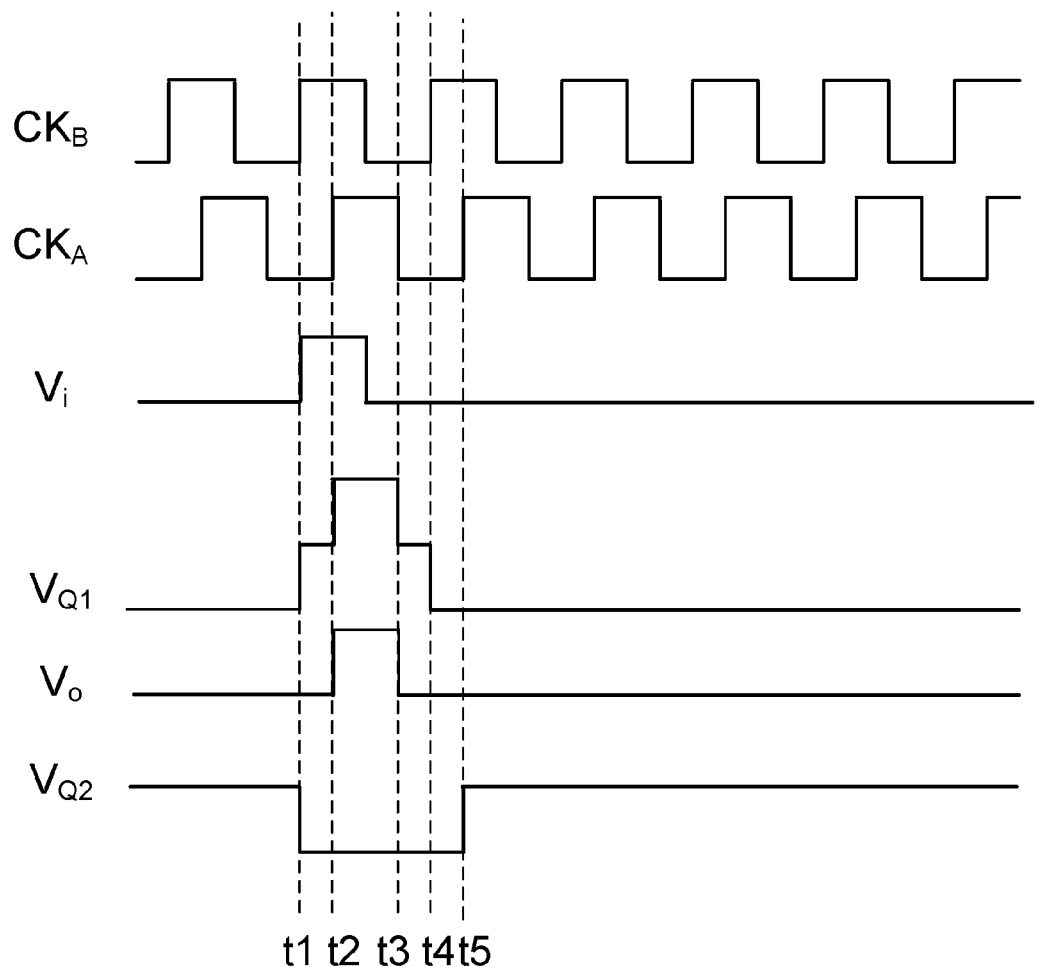
FIG. 15 is a timing diagram of the gate driving unit of FIG. 14 in accordance with one embodiment.

FIG. 15 is a timing diagram of the gate driving unit of FIG. 14 in accordance with one embodiment.

At the moment t1, the first pulse signals ($V_i$) are at the high level, and the second clock signals ($CK_B$) are at the high level. The first transistor (T1) and the third transistor (T3) are in the on state. The first pulse signals ($V_i$) charges the first control node ($Q_1$) via the third transistor (T3) such that the level ($V_{Q1}$) of the first control node ($Q_1$) is pulled up to be at the high level so as to turn on the second transistor (T2). The first clock signals ($CK_A$) are at the low level, and the gate signals ($V_o$) from the output end of the gate signals is pulled down to be at the low level by the second transistor (T2). At the same time, the fifth transistor (T5) and the eighth transistor (T8) are turned on in response to the high level control of the first control node ($Q_1$). Further, the level ($V_{Q2}$) of the second control node ($Q_2$) is pulled down to be at the low level such that the sixth transistor (T6) and the seventh transistor (T7) are disconnected.

At the moment t2, the first clock signals ($CK_A$) are at the high level, and the second clock signals ($CK_B$) and the first pulse signals ($V_i$) are at the high level for the first half period. At this moment, the level ($V_{Q1}$) of the first control node ($Q_1$) remains at the high level such that the second transistor (T2) is in the on state. The level of the output end of the gate signals is sharply increased. When the first clock signals ($CK_A$) charges the output end of the gate signals, due to the bootstrap effect of the capacitor, the level ($V_{Q1}$) of the first control node ($Q_1$) is also pulled up such that the output end of the gate signals may be quickly charged to be at the high level so as to output the gate signals ($V_o$) at the high level. For the lower half period, the second clock signals ($CK_B$) and the first pulse signals ($V_i$) are at the low level. At this moment, the first transistor (T1) and the third transistor (T3) are turned off. As the level ($V_{Q1}$) of the first control node ($Q_1$) are at the high level, the second transistor (T2) remains in the on state such that the output end of the gate signals outputs the gate signals ($V_o$) at the high level.

At the moment t3, the first clock signals ($CK_A$) drops from the high level ($V_{H1}$) to the low level ($V_{L1}$). As the level ($V_{Q1}$) of the first control node ($Q_1$) are still at the high level such that the second transistor (T2) is in the on state. Thus, the output end of the gate signals is discharged via the turned-on second transistor (T2) such that the level of the gate signals ($V_o$) from the output end of the gate signals may be quickly dropped to be at the low level. Due to the bootstrap effect of the capacitor, the level ($V_{Q1}$) of the first control node ($Q_1$) drops to be $V_{H1}-V_{TH1}$.

At the moment t4, the second clock signals ($CK_B$) is pulled up from the low level to be at the high level, and the third transistor (T3) is turned on such that the level ($V_{Q1}$) of the first control node ($Q_1$) is pulled down to be at the low level of the first pulse signals ($V_i$). In this way, the fifth transistor (T5) and the eighth transistor (T8) are turned off. As the first clock signals ($CK_A$) are at the low level, the fourth transistor (T4) is in the off state, such that the level ($V_{Q2}$) of the second control node ($Q_2$) remains at the low level.

At the moment t5, the first clock signals ($CK_A$) is pulled up from the low level ($V_{L1}$) to the high level ($V_{H1}$). By coupling a high voltage to the gate of the fourth transistor (T4) via the second capacitor (C2), the fourth transistor (T4) is turned on. The high voltage source ($V_{DD}$) charges the second control node ($Q_2$) via the turned-on fourth transistor (T4) such that the level ($V_{Q2}$) of the second control node ($Q_2$) is pulled up to be $V_{H2}-V_{TH4}$, wherein $V_{TH4}$ is the threshold voltage of the fourth transistor (T4). At this moment, the sixth transistor (T6) and the seventh transistor (T7) are turned on. The level ($V_{Q1}$) of the first control node ($Q_1$) is pulled down to be the low level ($V_L$) by the turned-on sixth transistor (T6). The level of the second pole of the second transistor (T2) is pulled down to be the low level ($V_L$) by the turned-on seventh transistor (T7). That is, the gate signals ($V_o$) outputted by the output end of the gate signals is pulled down to be at the low level ($V_L$).

In the present disclosure, the gate driving unit does not need the feedback signals from the units at later levels.

It can be understood that the control module 13 of the gate driving unit in FIG. 14 may be the control module in FIG. 5, 6, 9, 10 or 11. In addition, the control module 13 may include the second low level maintaining module in FIG. 6, 9, 10 or 11.

In one embodiment, the gate driving circuit includes M number of cascaded gate driving units, wherein M is an integer larger than one, and the gate driving unit may be the gate driving unit in the above embodiments. The input end of the pulse signals of the gate driving unit at the N-th level connects to the output end of the gate signals of the gate driving unit at the (N−1)-th level, wherein N is an integer and is in a range of 1<N≤M. In another example, the input end of the pulse signals of the gate driving unit at the N-th level connects to the output end of the gate signals of the gate driving unit at the (N−2)-th level, wherein N is an integer and is in a range of 2<N≤M.

Wherein with respect to the M number of cascaded gate driving units, the structures are the same, for instance, the gate driving unit in FIGS. 2, 5, 6, 9, 10, 11, or 14.

It can be understood that with respect to the M number of cascaded gate driving units, the structure of the gate driving units may be the same or different.

Eighth Embodiment

Figure 16:
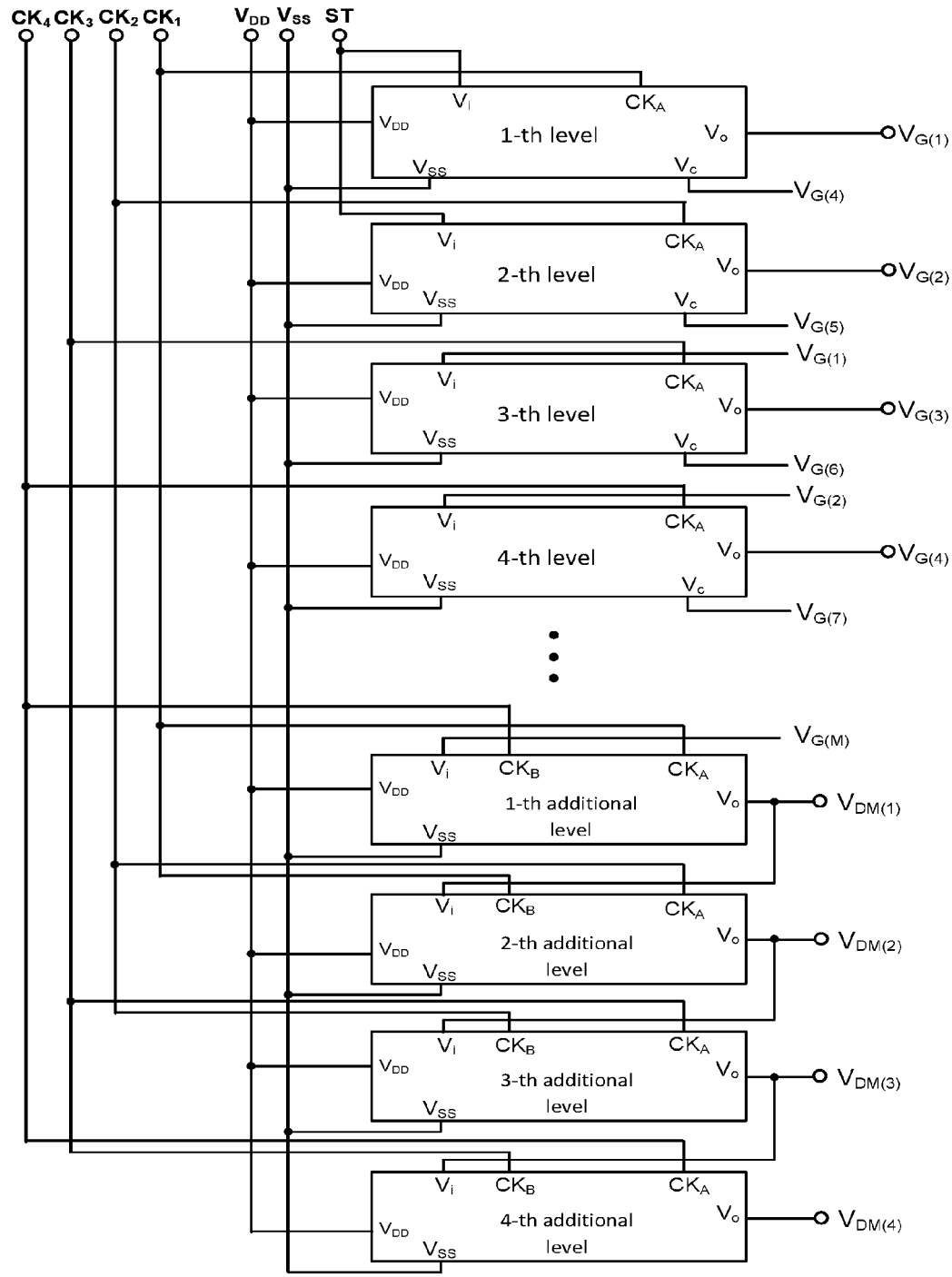
FIG. 16 is a schematic view of the gate driving unit in accordance with one embodiment.
Figure 19:
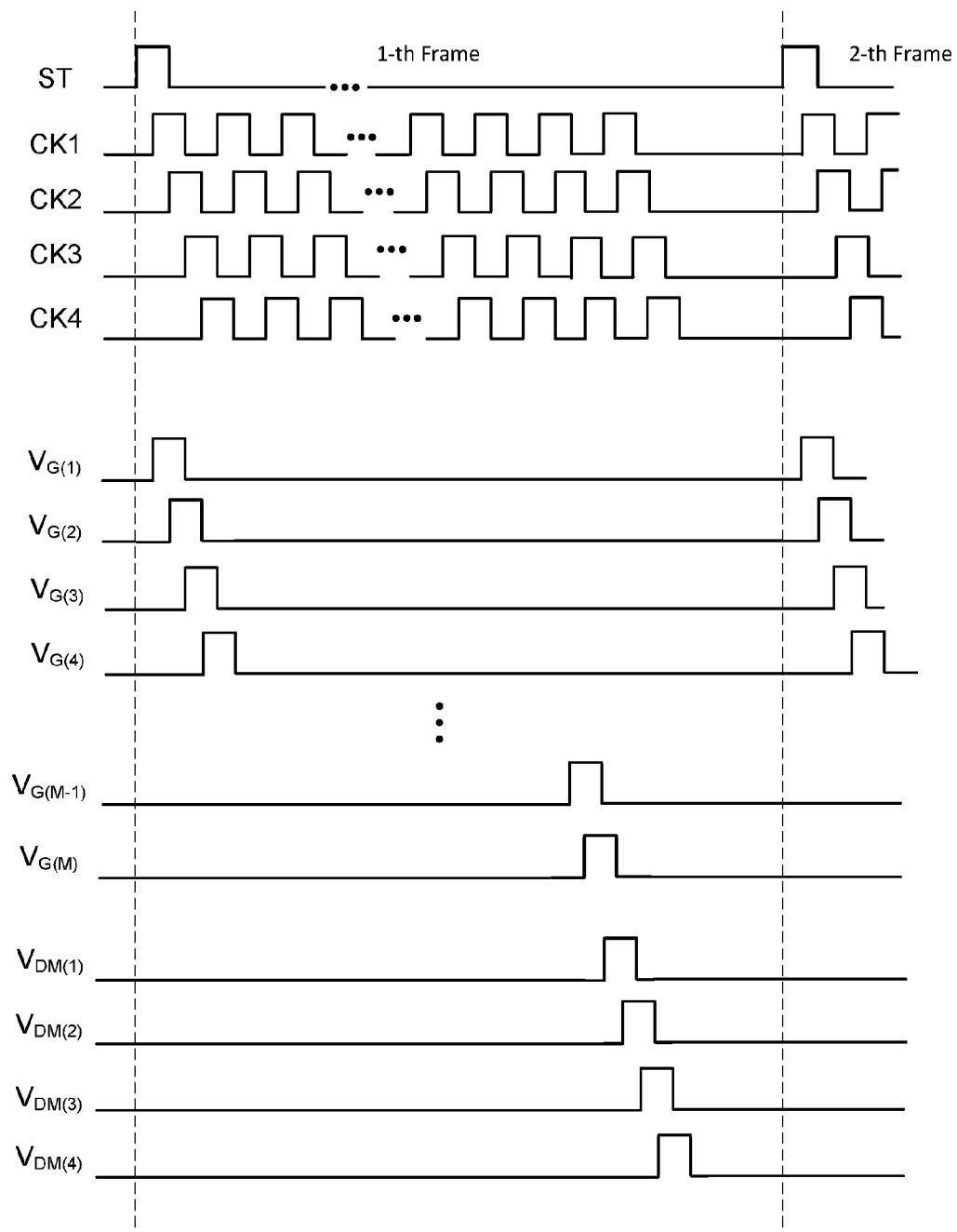
FIG. 19 is a timing diagram of the gate driving unit in accordance with one embodiment.

FIG. 16 is a schematic view of the gate driving unit in accordance with one embodiment. FIG. 19 is a timing diagram of the gate driving unit of FIG. 16. The gate driving circuit includes M number of cascaded gate driving units, wherein M is an integer larger than one. The output end of the gate signals of each of the gate driving units provides the scanning signals to one scanning line, wherein the input end of the pulse signals of the gate driving unit at the N-th level connects to the output end of the gate signals of the gate driving unit at the (N−1)-th level, wherein N is an integer and is in a range of 1<N≤M. In another example, the input end of the pulse signals of the gate driving unit at the N-th level connects to the output end of the gate signals of the gate driving unit at the (N−2)-th level, wherein N is an integer and is in a range of 2<N≤M.

Specifically, in the embodiment, the gate driving circuit further includes a plurality of clock signal lines. As shown, the gate driving circuit includes four clock signal lines ($CK_1$~$CK_4$), the high level signal line ($V_{DD}$), the low level signal line ($V_{SS}$), and a turn-on signal line (ST). The turn-on signal line (ST) relates to pulse signals. The M number of cascaded gate driving units may be divided to a main driving unit and an additional gate driving unit. The main driving unit includes the gate driving units at the first through the (M−4)-th level. The additional gate driving unit includes the gate driving units at the (M−3)-th through M-th level.

Wherein each of the gate driving units at the first through the (M−4)-th gate driving units may be the gate driving unit in FIG. 2 or 5.

With respect to the gate driving units at the first through the (M−4)-th levels, the input end of the pulse signals ($V_i$) connects to the output end of the gate signals of the (J−2)-th gate driving unit, wherein J is an integer and is in a range of 2<J≤M−4. The input end of the pulse signals of the gate driving unit at the first and the second level connect to the turn-on signal line (ST) to obtain the first pulse signals ($V_i$). The clock signal input end ($CK_A$) of each of the gate driving units connects to one clock signals. The first pull-down control end ($V_c$) connects to the output end of the gate signals of the gate driving unit at the (K+3)-th level. That is, the first control signals ($V_c$) of each of the gate driving unit are the gate signals from the output end of the gate signals of the (K+3)-th level, wherein K is an integer and is in a range of 1≤K≤M−4. The first input signal end of each of the gate driving units connects to the high voltage signal line ($V_{DD}$), and the low level node ($Q_3$) connects to the low level signal line ($V_{SS}$).

It can be understood that with respect to the gate driving unit at the first through the (M−4)-th level, the input end of the pulse signals of the gate driving unit at the J-th level may connect to the output end of the gate signals of the gate driving unit at the (J−1)-th level, wherein J is an integer and is in a range of 1<J≤M−4.

Wherein the gate driving units at the (M−3)-th through the M-th levels, i.e., the 1-th to the 4-th additional level, may be the gate driving unit in FIG. 14. With respect to the gate driving units at the (M−3)-th through the M-th level, the input end of the pulse signals of each of the gate driving units connect to the output end of the gate signals of the previous gate driving unit. The clock signal input end ($CK_A$) and the first pull-down control end ($CK_B$) within the same gate driving unit connect to different clock signal lines.

Ninth Embodiment

Figure 17:
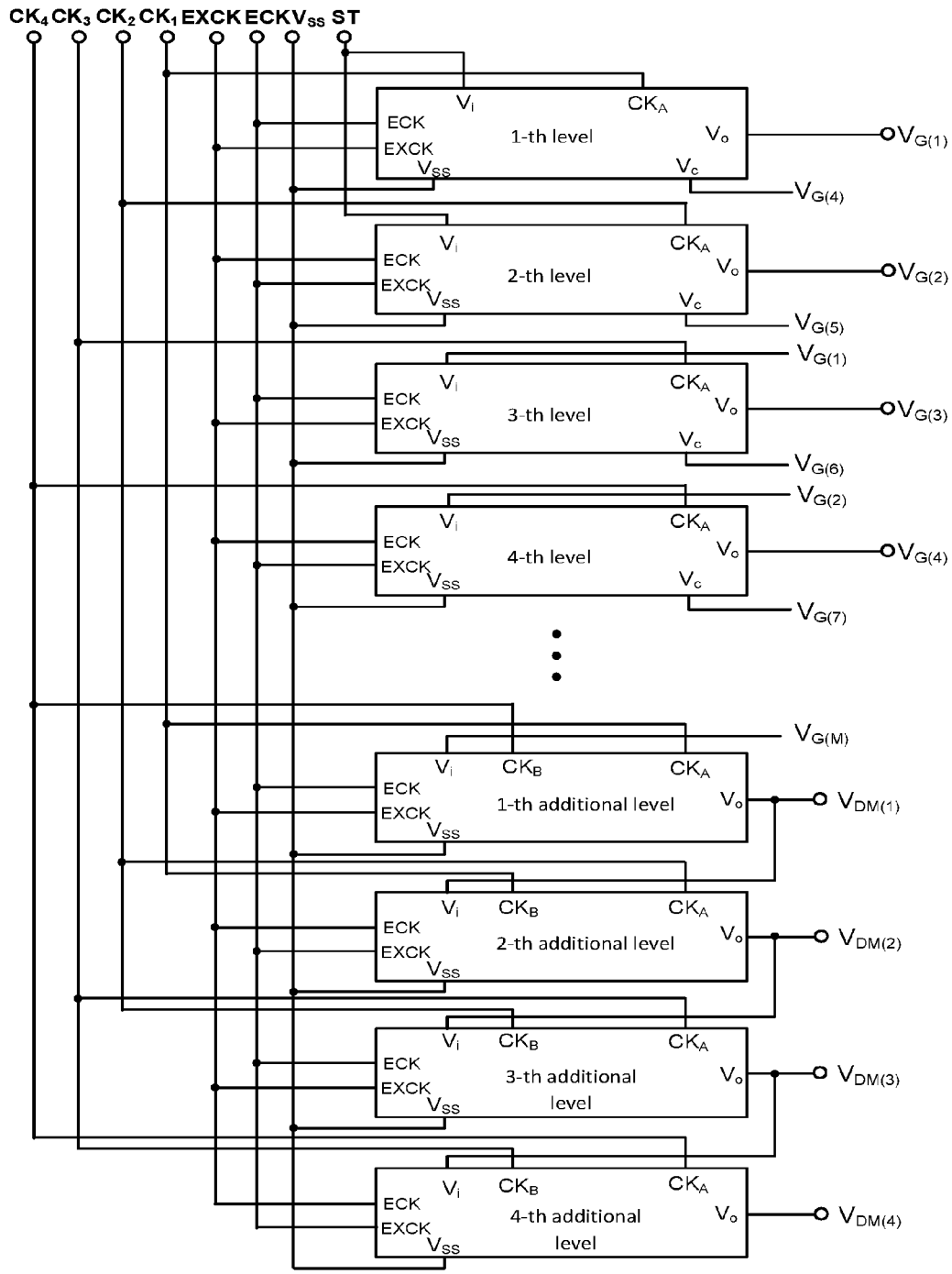
FIG. 17 is a schematic view of the gate driving unit in accordance with another embodiment.
Figure 18:
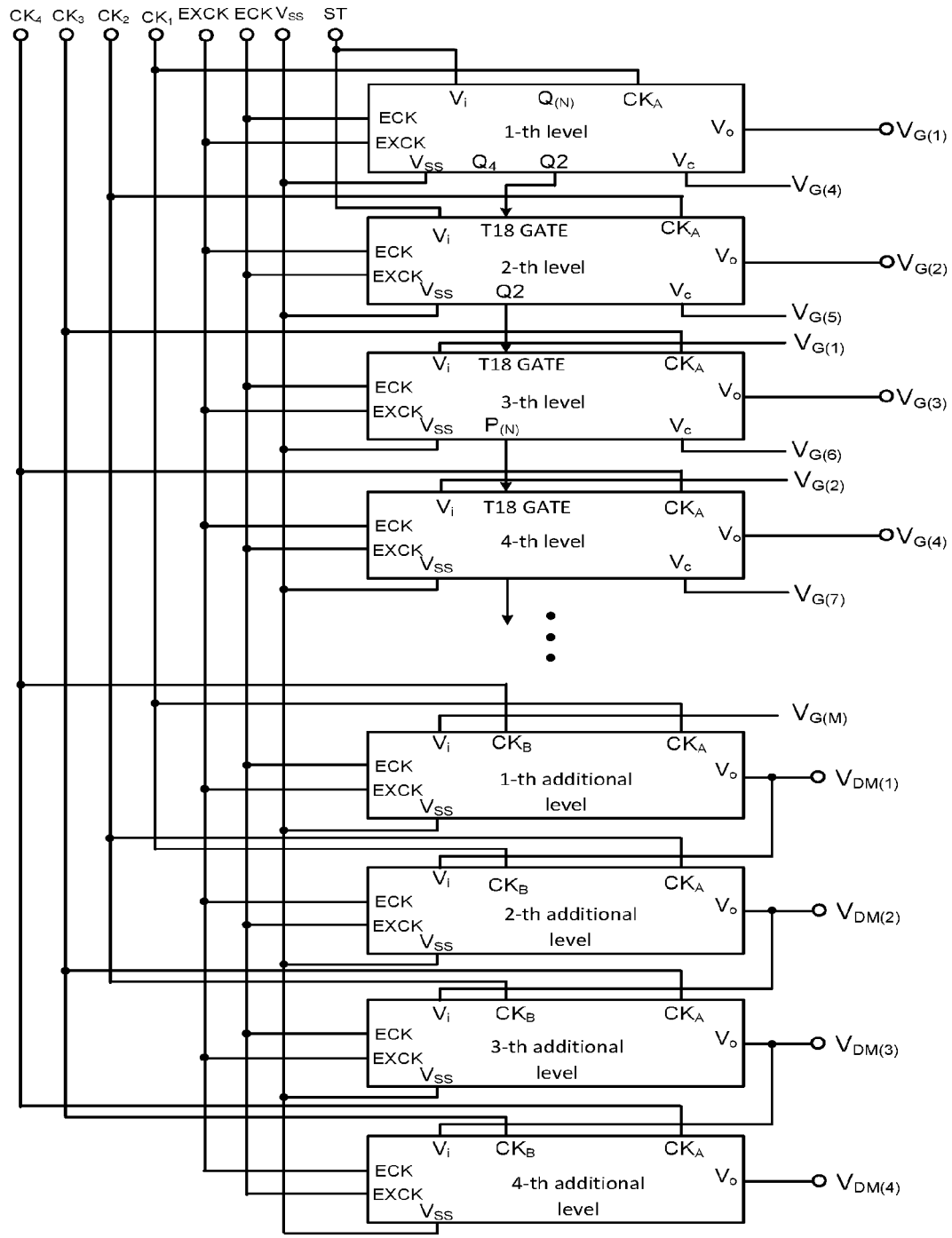
FIG. 18 is a schematic view of the gate driving unit in accordance with another embodiment.

FIG. 17 is a schematic view of the gate driving unit in accordance with another embodiment, wherein the gate driving circuit includes M number of cascaded gate driving units, wherein M is an integer larger than one. The output end of the gate signals of each of the gate driving units provides the scanning signals to one scanning line.

Wherein the input end of the pulse signals of the gate driving unit at the N-th level connects to the output end of the gate signals of the gate driving unit at the (N−1)-th level, wherein N is an integer and is in a range of 1<N≤M. In another example, the input end of the pulse signals of the gate driving unit at the N-th level connects to the output end of the gate signals of the gate driving unit at the (N−2)-th level, wherein N is an integer and is in a range of 2<N≤M.

Specifically, in the embodiment, the gate driving circuit further includes a plurality of clock signal lines. As shown, the gate driving circuit includes four clock signal lines ($CK_1$~$CK_4$), the high level signal line ($V_{DD}$), the low level signal line ($V_{SS}$), and a turn-on signal line (ST). The turn-on signal line (ST) relates to pulse signals. The M number of cascaded gate driving units may be divided to a main driving unit and an additional gate driving unit. The main driving unit includes the gate driving units at the first through the (M−−4)-th level. The additional gate driving unit includes the gate driving units at the (M−3)-th through M-th level.

Wherein each of the gate driving units at the first through the (M−4)-th gate driving units may be the gate driving unit in FIG. 6, 9, and or 10. The input end of the pulse signals ($V_i$), the clock signal input end ($CK_A$), and the first pull-down control end ($V_c$) may be connected the same with that in FIG. 16, and thus the connection relationship is omitted hereinafter. In addition, the first pole of the fourth transistor (T4) of the gate driving units at the first through the (M−4)-th level connects to the fourth clock signals (ECK), the gate of the thirteenth transistor (T13) connects to the third clock signals (EXCK), the first pole of the ninth transistor (T9) connects to the third clock signals (EXCK), and the gate of the fourteenth transistor (T14) connects to the fourth clock signals (ECK).

Wherein the gate driving units at the (M−3)-th through the M-th levels, i.e., the 1-th to the 4-th additional level, may be the gate driving unit in FIG. 14. In addition, the gate driving unit further includes the ninth transistor (T9), the tenth transistor (T10), the eleventh transistor (T11), and the twelevth transistor (T12) in FIG. 6. The connection relationship of the ninth transistor (T9), the tenth transistor (T10), the eleventh transistor (T11), and the twelevth transistor (T12) are the same with that in FIG. 6, wherein the first pole of the fourth transistor (T4) connects to the clock signal line (ECK) and the first pole of the ninth transistor (T9) connects to the clock signal line (EXCK).

It can be understood that the gate driving units at the (M−3)-th through the M-th level may be the gate driving unit in FIG. 14. In addition, the gate driving unit includes the ninth transistor (T9), the tenth transistor (T10), the eleventh transistor (T11), the twelevth transistor (T12), the thirteenth transistor (T13), and the fourteenth transistor (T14). The connection relationship between the transistors are the same with that in FIG. 9. Wherein the first pole of the fourth transistor (T4) connects to the clock signal line (ECK), the gate of the thirteenth transistor (T13) connects to the clock signal line (EXCK), the first pole of the ninth transistor (T9) connects to the clock signal line (EXCK), and the gate of the fourteenth transistor (T14) connects to the clock signal line (ECK). The gate driving units at the (M−3)-th through the M-th level may be the gate driving unit in FIG. 14 including the transistor T9, T10, T11, T12, T16 and T17. The connection relationship of the transistors is the same with that in FIG. 10.

Tenth Embodiment

FIG. 19 is a timing diagram of the gate driving unit in accordance with one embodiment. The difference between the gate driving unit in FIGS. 19 and 17 resides in that: with respect to the gate driving unit at the 2-th through the (M−4)-th level, the gate of the eighteenth transistor (T18) and the nineteenth transistor (T19) within the second low level maintaining module 16 of the gate driving unit at the H-th level connects to the second control node ($Q_2$) of the gate driving unit at the (H−1)-th level, wherein H is an integer and is in a range of 1<H≤M−4. In the embodiment, the connection relationship of the gate driving units at the first level is the similar to that of the gate driving units at the (M−3)-th through the M-th level, and thus is omitted hereinafter.

Figure 20:
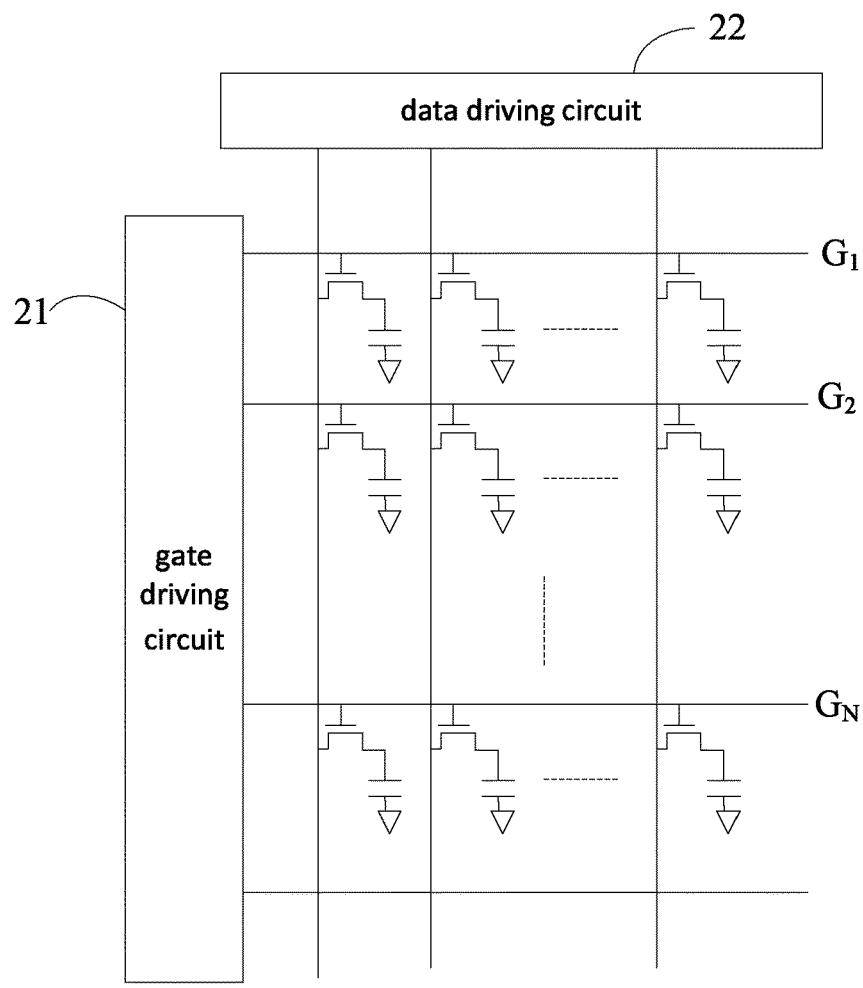
FIG. 20 is a schematic view of the display device in accordance with one embodiment.

FIG. 20 is a schematic view of the display device in accordance with one embodiment. The display device is a liquid crystal device (LCD) including a plurality of scanning lines ($G_1$~$G_N$), and a gate driving circuit 21 providing the gate signals to the scanning lines ($G_1$~$G_N$). The gate driving circuit 21 may be the gate driving circuit in the above embodiment. The corresponding TFTs are driven by providing the scanning signals to the scanning lines ($G_1$~$G_N$). Afterward, the data driving circuit 22 provides the display signals to the pixels via the turned-on TFTs so as to display images.

Figure 21:
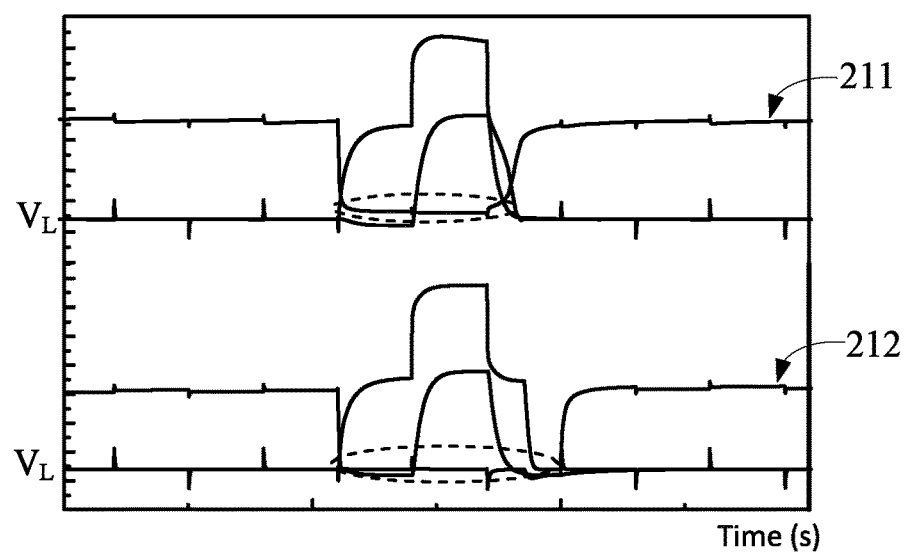
FIG. 21 is a waveform diagram showing the signals of the third pull-down control end of the low level maintaining module of the present disclosure and the signals of the control end of the low level maintaining module of the conventional gate driving unit.

In view of the above, the control end of the low level maintaining module may be pulled down to the low level to decrease the electrical leakage of the low level maintaining module and to enhance the efficiency of the circuit. FIG. 21 is a waveform diagram showing the signals of the third pull-down control end of the low level maintaining module of the present disclosure and the signals of the control end of the low level maintaining module of the conventional gate driving unit, wherein the signal waveform 211 relates to the signals waveform of the control end of the low level maintaining module, and the signal waveform 212 relates to the signal waveform of the control end of the low level maintaining module, i.e., the signal waveform of the second control end, in accordance with one embodiment. As shown, during the driving phases, i.e., t1~t4 (the dashed-line ellipse), the level of the control end of the low level maintaining module can be completely pulled down to be at the low level ($V_L$) such that the electrical leakage may be effectively decreased.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A gate driving circuit for driving liquid crystal panels, comprising:

M number of cascaded gate driving units, wherein M is an integer larger than one, each of the gate driving units comprises an input module, an output module, a control module, and a first low level maintaining module;

the input module comprises a pulse signal input end for inputting first pulse signals, a first pull-down control end for inputting first control signals, and a control signal output end coupling with a first control node, the input module controls a level of the first control node in accordance with the first pulse signals and the first control signals;

the output module comprises a driving control end coupling with the first control node, a clock signal input end for inputting first clock signals, and an output end of gate signals, when being controlled by the level of the first control node, the output module outputs gate strobe signals and gate cutoff signals via the output end of gate signals;

the control module comprises a clock signal input end for inputting first clock signals, a first input signal end for inputting first input signals, a second pull-down control end coupling a second control node, a first control end coupling with the first control node, and a first pull-down end coupling with a low level node, the low level node is configured for inputting low level signals, when being controlled by a high level of the first control node, the control module pulls down the level of the second control node to be at the low level before the output module outputs the gate strobe signals and during an output period of the gate cutoff signals;

the first low level maintaining module comprises a third pull down control end coupling with the second control node, a first end coupling with the first control node, a second end coupling with the output end of the gate driving signals of the output module, and a third end coupling with the low level node, when being controlled by the low level of second control node, the first low level maintaining module is in an off state before the output module outputs the gate strobe signals and during an output period of the gate cutoff signals;

wherein an input end of the pulse signals of the gate driving unit at the N-th level connects to the output end of the gate signals of the gate driving unit at the (N−1)-th level, wherein N is an integer and is in a range of 1<N≤M, or the input end of the pulse signals of the gate driving unit at the N-th level connects to the output end of the gate signals of the gate driving unit at the (N−2)-th level, wherein N is an integer and is in a range of 2<N≤M.

2. The gate driving circuit as claimed in claim 1, wherein:

the input module comprises a first transistor and a third transistor, a gate of the first transistor connects with a first pole of the first transistor for inputting the first pulse signals, a second pole of the first transistor and the first pole of the third transistor connect to the first control node, a gate of the third transistor is configured for inputting the first control signals, the first control signals are second pulse signals or second clock signals, the high level of the first clock signals and the high level of the second clock signals are overlapped for ¼ clock period;

the output module comprises a second transistor, and a gate of the second transistor connects to the first control node, a first pole of the second transistor is configured for inputting the first clock signals, and a second pole of the second transistor is the output end of the gate signals;

the control module comprises a fourth transistor, a fifth transistor, an eighth transistor, and a second capacitor, wherein a gate of the fourth transistor and a first pole of the eighth transistor connect with one end of the second capacitor, and the other end of the second capacitor is configured for inputting the first clock signals, gates of the eighth transistor and the fifth transistor connect to the first control node, a second pole of the eighth transistor and a second pole of the fifth transistor connects to the low level node, a first pole of the fifth transistor and a second pole of the fourth transistor connect to the second control end, and the first pole of the fourth transistor is configured for inputting the first input signals; and the first low level maintaining module comprises a sixth transistor and a seventh transistor, wherein a gate of the sixth transistor and a gate of the seventh transistor connect to the second control node, a first pole of the sixth transistor connects with the first control node, a second pole of the sixth transistor and a second pole of the seventh transistor connects to the low level node, and the first pole of the seventh transistor connects to the second pole of the second transistor.

3. The gate driving circuit as claimed in claim 2, wherein for each of the gate driving units at the first through the (M−4)-th level, the second pole of the third transistor connects to the low level node, and the first control signals inputted from the gate of the third transistor are the second pulse signals; and for each of the gate driving units at the (M−3)-th through the M-th level, the second pole of the third transistor connects to the first pole of the first transistor, and the first control signals inputted from the gate of the third transistor are the second clock signals.

4. The gate driving circuit as claimed in claim 2, wherein the control module further comprises a fifteenth transistor, a gate of the fifteenth transistor connects to the gate of the first transistor, a first pole of the fifteenth transistor connects to the second control node, and the second pole of the fifteenth transistor connects to the low level node.

5. The gate driving circuit as claimed in claim 2, wherein the gate driving unit further comprises a second low level maintaining module, the control module further comprises a ninth transistor and a tenth transistor, and the second low level maintaining module comprises an eleventh transistor and a twelevth transistor;

wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelevth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelevth transistor connect to the low level node, and the first pole of the twelevth transistor connects to the first control node; and the first input signals inputted by the fourth transistor are the fourth clock signals, wherein the third clock signals and the fourth clock signals are two low frequency clock signals.

6. The gate driving circuit as claimed in claim 5, wherein the control module further comprises a thirteenth transistor and a fourteenth transistor, a gate of the thirteenth transistor is configured for inputting the third clock signals, a first pole of the thirteenth transistor connects to the first pole of the fourth transistor, a second pole of the thirteenth transistor connects to the second control node, a gate of the fourteenth transistor is configured for inputting the fourth clock signals, a first pole of the fourteenth transistor connects to the first pole of the ninth transistor, and a second pole of the fourteenth transistor connects to the second pole of the ninth transistor.

7. The gate driving circuit as claimed in claim 5, wherein the control module further comprises a sixteenth transistor and a seventeenth transistor, a gate of the sixteenth transistor and a gate of the seventeenth transistor connects to the gate of the first transistor, a first pole of the sixteenth transistor connects to the second pole of the ninth transistor, and a second pole of the sixteenth transistor and a second pole of the seventeenth transistor connects to the low level node, and the first pole of the seventeenth transistor connects to the second control node.

8. The gate driving circuit as claimed in claim 5, wherein for each of the gate driving units at the first through the (M−4)-th level, the second pole of the third transistor connects to the low level node, and the first control signals inputted from the gate of the third transistor are the second pulse signals; and
for each of the gate driving units at the (M−3)-th through the M-th level, the second pole of the third transistor connects to the first pole of the first transistor, and the first control signals inputted from the gate of the third transistor are the second clock signals.

9. The gate driving circuit as claimed in claim 2, wherein each of the gate driving unit further comprises a second low level maintaining module comprising an eighteenth transistor and a nineteenth transistor;
wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level; and
the first input signals from the first pole of the fourth transistor of the gate driving unit at the current level are the fourth clock signals.

10. The gate driving circuit as claimed in claim 2, wherein for each of the gate driving units at the first level and at the (M−3)-th through the M-th level, the gate driving unit further comprises a second low level maintaining module, the control module within each of the gate driving units at the first level and at the (M−3)-th through the M-th level further comprises a ninth transistor and a tenth transistor, and the second low level maintaining module further comprise an eleventh transistor and a twelevth transistor;
wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelevth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelevth transistor connect to the low level node, and the first pole of the twelevth transistor connects to the first control node, the first input signals from the first pole of the fourth transistor are the fourth clock signals, and the third clock signals and the fourth clock signals are two low frequency signals;
wherein the second pole of the third transistor of the gate driving unit at the first level connects to the low level node, and the first control signals inputted from the gate of the third transistor are the second pulse signals, for each of the gate driving units at the first level and at the (M−3)-th through the M-th level, the second pole of the third transistor connects to the first pole of the first transistor to input the first pulse signals, and the first control signals inputted by the gate of the third transistor are the second clock signals;
for each of the gate driving units at the second through the (M−4)-th level, the gate driving unit further comprises an eighteenth transistor and a nineteenth transistor,
wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level, the first input signals from the first pole of the fourth transistor of the gate driving unit at the current level are the fourth clock signals; and
wherein for each of the gate driving units at the second through the (M−4)-th level, the second pole of the third transistor connects to the low level node, and the first control signals inputted from the gate of the third transistor are the second pulse signals.

11. A display device, comprising:
a plurality of scanning lines and a gate driving circuit for providing gate signals to the scanning lines;
the gate driving circuit comprises M number of cascaded gate driving units, wherein M is an integer larger than one, each of the gate driving units comprises an input module, an output module, a control module, and a first low level maintaining module;

the input module comprises a pulse signal input end for inputting first pulse signals, a first pull-down control end for inputting first control signals, and a control signal output end coupling with a first control node, the input module controls a level of the first control node in accordance with the first pulse signals and the first control signals;

the output module comprises a driving control end coupling with the first control node, a clock signal input end for inputting first clock signals, and an output end of gate signals, when being controlled by the level of the first control node, the output module outputs gate strobe signals and gate cutoff signals via the output end of gate signals;

the control module comprises a clock signal input end for inputting first clock signals, a first input signal end for inputting first input signals, a second pull-down control end coupling a second control node, a first control end coupling with the first control node, and a first pull-down end coupling with a low level node, the low level node is configured for inputting low level signals, when being controlled by a high level of the first control node, the control module pulls down the level of the second control node to be at the low level before the output module outputs the gate strobe signals and during an output period of the gate cutoff signals;

the first low level maintaining module comprises a third pull down control end coupling with the second control node, a first end coupling with the first control node, a second end coupling with the output end of the gate driving signals of the output module, and a third end coupling with the low level node, when being controlled by the low level of second control node, the first low level maintaining module is in an off state before the output module outputs the gate strobe signals and during an output period of the gate cutoff signals;

wherein an input end of the pulse signals of the gate driving unit at the N-th level connects to the output end of the gate signals of the gate driving unit at the (N−1)-th level, wherein N is an integer and is in a range of 1<N≤M, or the input end of the pulse signals of the gate driving unit at the N-th level connects to the output end of the gate signals of the gate driving unit at the (N−2)-th level, wherein N is an integer and is in a range of 2<N≤M.

12. The display device as claimed in claim 11, wherein:

the input module comprises a first transistor and a third transistor, a gate of the first transistor connects with a first pole of the first transistor for inputting the first pulse signals, a second pole of the first transistor and the first pole of the third transistor connect to the first control node, a gate of the third transistor is configured for inputting the first control signals, the first control signals are second pulse signals or second clock signals, the high level of the first clock signals and the high level of the second clock signals are overlapped for ¼ clock period;

the output module comprises a second transistor, and a gate of the second transistor connects to the first control node, a first pole of the second transistor is configured for inputting the first clock signals, and a second pole of the second transistor is the output end of the gate signals;

the control module comprises a fourth transistor, a fifth transistor, an eighth transistor, and a second capacitor, wherein a gate of the fourth transistor and a first pole of the eighth transistor connect with one end of the second capacitor, and the other end of the second capacitor is configured for inputting the first clock signals, gates of the eighth transistor and the fifth transistor connect to the first control node, a second pole of the eighth transistor and a second pole of the fifth transistor connects to the low level node, a first pole of the fifth transistor and a second pole of the fourth transistor connect to the second control end, and the first pole of the fourth transistor is configured for inputting the first input signals; and the first low level maintaining module comprises a sixth transistor and a seventh transistor, wherein a gate of the sixth transistor and a gate of the seventh transistor connect to the second control node, a first pole of the sixth transistor connects with the first control node, a second pole of the sixth transistor and a second pole of the seventh transistor connects to the low level node, and the first pole of the seventh transistor connects to the second pole of the second transistor.

13. The display device as claimed in claim 12, wherein for each of the gate driving units at the first through the (M−4)-th level, the second pole of the third transistor connects to the low level node, and the first control signals inputted from the gate of the third transistor are the second pulse signals; and for each of the gate driving units at the (M−3)-th through the M-th level, the second pole of the third transistor connects to the first pole of the first transistor, and the first control signals inputted from the gate of the third transistor are the second clock signals.

14. The display device as claimed in claim 12, wherein the control module further comprises a fifteenth transistor, a gate of the fifteenth transistor connects to the gate of the first transistor, a first pole of the fifteenth transistor connects to the second control node, and the second pole of the fifteenth transistor connects to the low level node.

15. The display device as claimed in claim 12, wherein the gate driving unit further comprises a second low level maintaining module, the control module further comprises a ninth transistor and a tenth transistor, and the second low level maintaining module comprises an eleventh transistor and a twelevth transistor;

wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelevth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelevth transistor connect to the low level node, and the first pole of the twelevth transistor connects to the first control node; and the first input signals inputted by the fourth transistor are the fourth clock signals, wherein the third clock signals and the fourth clock signals are two low frequency clock signals.

16. The display device as claimed in claim 15, wherein the control module further comprises a thirteenth transistor and a fourteenth transistor, a gate of the thirteenth transistor is configured for inputting the third clock signals, a first pole of the thirteenth transistor connects to the first pole of the fourth transistor, a second pole of the thirteenth transistor connects to the second control node, a gate of the fourteenth transistor is configured for inputting the fourth clock signals, a first pole of the fourteenth transistor connects to the first pole of the ninth transistor, and a second pole of the fourteenth transistor connects to the second pole of the ninth transistor.

17. The display device as claimed in claim 15, wherein the control module further comprises a sixteenth transistor and a seventeenth transistor, a gate of the sixteenth transistor and a gate of the seventeenth transistor connects to the gate of the first transistor, a first pole of the sixteenth transistor connects to the second pole of the ninth transistor, and a second pole of the sixteenth transistor and a second pole of the seventeenth transistor connects to the low level node, and the first pole of the seventeenth transistor connects to the second control node.

18. The display device as claimed in claim 15, wherein for each of the gate driving units at the first through the (M−4)-th level, the second pole of the third transistor connects to the low level node, and the first control signals inputted from the gate of the third transistor are the second pulse signals; and for each of the gate driving units at the (M−3)-th through the M-th level, the second pole of the third transistor connects to the first pole of the first transistor, and the first control signals inputted from the gate of the third transistor are the second clock signals.

19. The display device as claimed in claim 12, wherein each of the gate driving unit further comprises a second low level maintaining module comprising an eighteenth transistor and a nineteenth transistor;

wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level; and the first input signals from the first pole of the fourth transistor of the gate driving unit at the current level are the fourth clock signals.

20. The display device as claimed in claim 12, wherein for each of the gate driving units at the first level and at the (M−3)-th through the M-th level, the gate driving unit further comprises a second low level maintaining module, the control module within each of the gate driving units at the first level and at the (M−3)-th through the M-th level further comprises a ninth transistor and a tenth transistor, and the second low level maintaining module 16 further comprise an eleventh transistor and a twelevth transistor;

wherein a gate of the ninth transistor connects to the gate of the fourth transistor, a first pole of ninth transistor is configured for inputting third clock signals, a second pole of the ninth transistor connects with a first pole of the tenth transistor, a gate of the eleventh transistor, and a gate of the twelevth transistor, the gate of the tenth transistor and the gate of the eighth transistor connect to the first control node, and the second pole of the tenth transistor connects to the low level node, the first pole of the eleventh transistor connects to the second pole of the second transistor, the second pole of the eleventh transistor and the second pole of the twelevth transistor connect to the low level node, and the first pole of the twelevth transistor connects to the first control node, the first input signals from the first pole of the fourth transistor are the fourth clock signals, and the third clock signals and the fourth clock signals are two low frequency signals;

wherein the second pole of the third transistor of the gate driving unit at the first level connects to the low level node, and the first control signals inputted from the gate of the third transistor are the second pulse signals, for each of the gate driving units at the first level and at the (M−3)-th through the M-th level, the second pole of the third transistor connects to the first pole of the first transistor to input the first pulse signals, and the first control signals inputted by the gate of the third transistor are the second clock signals;

for each of the gate driving units at the second through the (M−4)-th level, the gate driving unit further comprises an eighteenth transistor and a nineteenth transistor, wherein gates of the eighteenth transistor and the nineteenth transistor of the gate driving unit at the current level connect to the second control node of the gate driving unit at the previous level, a first pole of the eighteenth transistor of the gate driving unit at the previous level connects to the first control node of the gate driving unit at the current level, a second pole of the eighteenth transistor of the gate driving unit at the current level connects to the low level node of the gate driving unit at the current level, the first pole of the nineteenth transistor of the gate driving unit at the current level connects to the second pole of the second transistor of the gate driving unit at the current level, the second pole of the nineteenth transistor of the gate driving unit at the current level connects to the low level node of the gate driving unit at the current level, the first input signals from the first pole of the fourth transistor of the gate driving unit at the current level are the fourth clock signals; and wherein for each of the gate driving units at the second through the (M−4)-th level, the second pole of the third transistor connects to the low level node, and the first control signals inputted from the gate of the third transistor are the second pulse signals.

* * * * *